(12) United States Patent
Kanno et al.

(10) Patent No.: US 9,291,900 B2
(45) Date of Patent: Mar. 22, 2016

(54) COMPOSITION FOR FORMING RESIST UNDERLAYER FILM, CONTAINING SILICON THAT BEARS DIKETONE-STRUCTURE-CONTAINING ORGANIC GROUP

(75) Inventors: Yuta Kanno, Toyama (JP); Daisuke Sakuma, Funabashi (JP); Makoto Nakajima, Toyama (JP)

(73) Assignee: NISSAN CHEMICAL INDUSTRIES, LTD., Tokyo (JP)

(*) Notice: Subject to any disclaimer, the term of this patent is extended or adjusted under 35 U.S.C. 154(b) by 110 days.

(21) Appl. No.: 13/981,142

(22) PCT Filed: Jan. 24, 2012

(86) PCT No.: PCT/JP2012/051419
§ 371 (c)(1),
(2), (4) Date: Jul. 23, 2013

(87) PCT Pub. No.: WO2012/102261
PCT Pub. Date: Aug. 2, 2012

(65) Prior Publication Data
US 2013/0302991 A1 Nov. 14, 2013

(30) Foreign Application Priority Data

Jan. 24, 2011 (JP) ................................ 2011-012338

(51) Int. Cl.
G03F 7/075 (2006.01)
G03F 7/09 (2006.01)
G03F 7/20 (2006.01)
G03F 7/30 (2006.01)
G03F 7/36 (2006.01)
G03F 7/11 (2006.01)
C09D 183/06 (2006.01)
C08L 83/06 (2006.01)
H01L 21/308 (2006.01)
C09D 4/00 (2006.01)
C08G 77/14 (2006.01)

(52) U.S. Cl.
CPC .............. *G03F 7/0752* (2013.01); *C08L 83/06* (2013.01); *C09D 4/00* (2013.01); *C09D 183/06* (2013.01); *G03F 7/0755* (2013.01); *G03F 7/0757* (2013.01); *G03F 7/091* (2013.01); *G03F 7/094* (2013.01); *G03F 7/11* (2013.01); *G03F 7/2041* (2013.01); *G03F 7/30* (2013.01); *G03F 7/36* (2013.01); *H01L 21/3081* (2013.01); *H01L 21/3088* (2013.01); *C08G 77/14* (2013.01); *Y10T 428/31663* (2015.04)

(58) Field of Classification Search
None
See application file for complete search history.

(56) References Cited

FOREIGN PATENT DOCUMENTS

| JP | A-8-300544 | 11/1996 |
| JP | A-11-258813 | 9/1999 |
| JP | 2000-39292 | * 2/2000 |
| JP | A-2000-302932 | 10/2000 |
| JP | A-2004-115817 | 4/2004 |
| JP | A-2007-226170 | 9/2007 |

OTHER PUBLICATIONS

JPO English abstract for JP2000-39292 provided by JPO (2000).*
Machine-assisted English translation of JP2000-39292 provided by JPO (2000).*
Semenov et al ("Photoluminescence of Terbium-Containing Sol-Gel Glasses", Russian Journal of General Chemistry, vol. 79 (12), p. 2574-2577 (2009).*
International Search Report issued in International Application No. PCT/JP2012/051419 on Feb. 21, 2012 (with translation).
International Preliminary Report on Patentability issued in International Application No. PCT/JP2012/051419 on Jul. 30, 2013 (with translation).

* cited by examiner

*Primary Examiner* — Sin Lee
(74) *Attorney, Agent, or Firm* — Oliff PLC

(57) ABSTRACT

A composition for forming a lithographic resist underlayer film, including, as a silane, a hydrolyzable organosilane, a hydrolysate thereof, or a hydrolytic condensate thereof, wherein the silane includes a hydrolyzable organosilane of Formula (1) below:

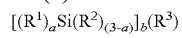

Formula (1)

[where $R^3$ is a group of Formula (2), (3), or (4):

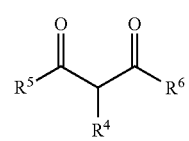

Formula (2)

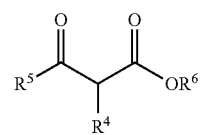

Formula (3)

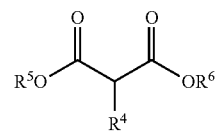

Formula (4)

(in Formulae (2), (3), and (4), at least one from among $R^4$, $R^5$, and $R^6$ is a group bonded to a silicon atom directly or through a linking group.), $R^1$ is an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof, $R^2$ is an alkoxy group, an acyloxy group, or a halogen atom].

12 Claims, No Drawings

COMPOSITION FOR FORMING RESIST UNDERLAYER FILM, CONTAINING SILICON THAT BEARS DIKETONE-STRUCTURE-CONTAINING ORGANIC GROUP

TECHNICAL FIELD

The present invention relates to a composition for forming an underlayer film between a substrate and a resist (for example, a photoresist or an electron beam resist) used in the production of semiconductor devices. More particularly, the present invention relates to a composition for forming a lithographic resist underlayer film for forming an underlayer film that is used for an underlayer of a photoresist in a lithography process of semiconductor device production. The present invention also relates to a method for forming a resist pattern using the composition for forming an underlayer film.

BACKGROUND ART

Fine lithographic processing using a photoresist has been performed in the production of semiconductor devices. In the fine processing, a thin film of a photoresist is formed on a semiconductor substrate such as a silicon wafer, this film is irradiated with an active light radiation such as UV radiation through a mask pattern provided with the pattern of a semiconductor device, the film is developed, and the substrate is etched using the obtained photoresist pattern as a protective film, thereby forming fine protrusions and depressions corresponding to the pattern on the substrate surface. However, a trend has recently been developed to the increase in the degree of integration of semiconductor devices and a transition to a shorter wavelength of the active light radiation used, namely, from KrF excimer lasers (248 nm) to ArF excimer lasers (193 nm). As a result, an effect on reflection of active light radiation from semiconductor substrates has been becoming a serious problem.

Further, films including a metal element such as silicon or titanium and known as hard masks have been used as underlayer films between the semiconductor substrate and the photoresist (see, for example, Patent Document 1). In this case, since the resist and the hard mask differ significantly in constituent components from each other, the removal rate thereof by dry etching strongly depends on the type of gas used for dry etching. Further, by selecting the adequate gas, it is possible to remove the hard mask by dry etching, without a significant reduction in the photoresist film thickness. Thus, in recent years, resist underlayer films have been disposed between semiconductor substrates and photoresists in the production of semiconductor devices to attain a variety of effects such as an anti-reflection effect. Compositions for the resist underlayer films have also been investigated, but due to a great variety of the required characteristics thereof, the development of new materials for the resist underlayer films is desired.

For example, the application, to the lithography process, of a polysiloxane material obtained from a silane having a diester structure including an acid unstable group has been described (see Patent Document 2).

PRIOR ART DOCUMENTS

Patent Documents

Patent Document 1: Japanese Patent Application Publication No. 11-258813 (JP 11-258813 A)
Patent Document 2: Japanese Patent Application Publication No. 2007-226170 (JP 2007-226170 A)

SUMMARY OF THE INVENTION

Problems to be Solved by the Invention

It is an object of the present invention to provide a composition for forming a lithographic resist underlayer film that can be used in the production of semiconductor devices. More particularly, the object is to provide a composition for forming a lithographic resist underlayer film to form a resist underlayer film usable as a hard mask. Another object is to provide a composition for forming a lithographic resist underlayer film to form a resist underlayer film usable as an anti-reflective film. Yet another object is to provide a lithographic resist underlayer film that does not intermix with the resist and has a dry etching rate higher than that of the resist and also to provide a composition for forming resist underlayer film to form such an underlayer film.

Still another object of the present invention is to provide a composition for forming a resist underlayer film to form a resist underlayer film that can improve the pattern shape of the patterned resist film.

Yet another object of the present invention is to provide a method for producing a semiconductor device using the composition for forming the resist underlayer film.

Means for Solving the Problems

A first aspect of the present invention provides a composition for forming a lithographic resist underlayer film, comprising, as a silane, a hydrolyzable organosilane, a hydrolysate thereof, or a hydrolytic condensate thereof, wherein the silane includes a hydrolyzable organosilane of Formula (1) below:

$$[(R^1)_a Si(R^2)_{(3-a)}]_b(R^3) \qquad \text{Formula (1)}$$

[where $R^3$ is a group of Formula (2), (3), or (4):

Formula (2)

Formula (3)

Formula (4)

(in Formulae (2), (3), and (4), at least one from among $R^4$, $R^5$, and $R^6$ is a group bonded to a silicon atom by a single bond or as a linking group; when $R^4$ is not bonded to the silicon atom, $R^4$ is a hydrogen atom, or an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof;

when $R^5$ and $R^6$ are not bonded to the silicon atom, each of $R^5$ and $R^6$ is independently a linear alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof;

when any of $R^4$, $R^5$ or $R^6$ is a group bonded to the silicon atom as a linking group, the group bonded to the silicon atom is a divalent group obtained by removing one hydrogen atom from the respective group defined above; however, when $R^6$ in Formula (3), $R^5$ in Formula (4), and $R^6$ in Formula (4) are bonded to the silicon atom, these groups are groups each bonded to the silicon atom as a linking group, rather than by a single bond); each $R^1$ is independently an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof; each $R^2$ is independently an alkoxy group, an acyloxy group, or a halogen atom; a is integer of 0 to 2, b is integer of 1 to 3)].

A second aspect of the present invention provides the composition according to the first aspect, wherein the hydrolyzable organosilane comprises at least one selected from a group consisting of a combination of at least one organosilicon compound selected from a group consisting of an organosilicon compound of Formula (5) below:

Formula (5)

(where each $R^1$ is independently an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an alkoxyaryl group, an acyloxyaryl group, or a cyano group, or a combination thereof, and is a group bonded to the silicon atom by a Si—C bond; each $R^2$ is independently an alkoxy group, an acyloxy group, or a halogen atom; a is integer of 0 to 3), and an organosilicon compound of Formula (6) below:

Formula (6)

(where $R^1$ is an alkyl group, each $R^2$ is independently an alkoxy group, an acyloxy group, or a halogen atom, Y is an alkylene group or an arylene group, b is integer of 0 or 1, and c is integer of 0 or 1), and the hydrolyzable organosilane of Formula (1), hydrolysates thereof, and hydrolytic condensates thereof.

A third aspect of the present invention provides the composition according to the first aspect or second aspect, wherein the hydrolytic condensate of the hydrolyzable organosilane of Formula (1), or the hydrolytic condensate of the hydrolyzable organosilane of Formula (1) and the organosilicon compound of Formula (5) is contained as a polymer.

A fourth aspect of the present invention provides the composition according to any one of the first to third aspects, wherein the hydrolyzable organosilane of Formula (1) has a pKa value of 8.00 to 20.00.

A fifth aspect of the present invention provides the composition according to any one of the first to fourth aspects, further comprising an acid as a hydrolysis catalyst.

A sixth aspect of the present invention provides the composition according to any one of the first to fifth aspects, further comprising water.

A seventh aspect of the present invention provides a resist underlayer film obtained by coating the composition for forming the resist underlayer film according to any one of the first to sixth aspects on a semiconductor substrate and performing baking.

An eighth aspect of the present invention provides a method for producing a semiconductor device, comprising these processes such as: coating the composition for forming the resist underlayer film according to any one of the first to sixth aspects on a semiconductor substrate and performing baking to form a resist underlayer film; coating a composition for forming a resist film on the underlayer film and forming a resist film; exposing the resist film; developing the resist film after the exposure to obtain a patterned resist film; etching the resist underlayer film according to the patterned resist film to obtain a patterned resist underlayer film; and processing the semiconductor substrate according to the patterned resist film and the patterned resist underlayer film.

A ninth aspect of the present invention provides a method for producing a semiconductor device, comprising these processes such as: foaming an organic underlayer film on a semiconductor substrate; coating the composition for forming a lithographic resist underlayer film according to any one of the first to sixth aspects on the organic underlayer film and performing baking to form a resist underlayer film; coating a composition for forming a resist film on the resist underlayer film and forming a resist film; exposing the resist film; developing the resist film after the exposure to obtain a patterned resist film; etching the resist underlayer film according to the patterned resist film to obtain a patterned resist underlayer film; etching the organic underlayer film according to the patterned resist underlayer film; and processing the semiconductor substrate according to the patterned organic underlayer film.

Effects of the Invention

Since the composition for forming a resist underlayer film according to the present invention comprises a hydrolyzable organosilane, the resist underlayer film formed using the composition has a polyorganosiloxane structure and, therefore, has sufficient resistance to dry etching with an oxygen-containing dry etching gas and can be used as a hard mask when a substrate (or an organic underlayer film) is processed.

Further, the resist underlayer film formed using the composition for forming a resist underlayer film according to the present invention can be used as an anti-reflective film, demonstrates no intermixing with the resist, and has a dry etching rate higher than that of the resist film.

Further, the resist underlayer film formed using the composition for forming a resist underlayer film according to the present invention has a structure in which an organic group incorporated in the polymer constituting the underlayer film has a specific value of degree of acidity. As a result, it is possible to improve the pattern shape of the resist film obtained by patterning.

With the production method according to the present invention, a semiconductor device can be advantageously produced by using the film formed from the composition for forming a resist underlayer film as a resist underlayer film.

MODES FOR CARRYING OUT THE INVENTION

The features of the present invention will be explained below in greater detail.

According to the present invention, a resist underlayer film is formed on a substrate by a coating method, or a resist underlayer film is formed by a coating method on a substrate, with an organic underlayer film being interposed therebetween, and a resist film (for example, a photoresist or an electron beam resist) is formed on the resist underlayer film. The resist pattern is then formed by exposure and development, the resist underlayer film is dry etched using the resist pattern, pattern transfer is performed, and the substrate is processed according to this pattern, or the organic underlayer film is etched to perform pattern transfer and the substrate is processed using the organic underlayer film.

There is a trend to decreasing the resist film thickness to prevent patterns from collapsing when fine patterns are formed. Due to such reduction in the resist thickness, the dry etching performed to transfer the pattern to the film in the underlayer cannot transfer the pattern unless the etching rate is higher than that of the film of the upper layer. According to the present invention, an organic underlayer film is coated on a substrate, or an organic underlayer film is not interposed and the resist underlayer film (including an inorganic silicon compound) is coated directly on a substrate, and then a resist film (organic resist film) is coated on the resist underlayer film. The dry etching rate of films including an organic component and films including an inorganic component differ significantly depending on the selected etching gas. Thus, the film including an organic component has a high dry etching rate with an oxygen-containing gas, and the film including an inorganic component has a high dry etching rate with a halogen-containing gas.

For example, a resist pattern is formed, the resist underlayer film according to the present invention that is in the underlayer of the resist pattern is dry etched with a halogen-containing gas to transfer the pattern to the resist underlayer film, and the substrate is processed using the halogen-containing gas with the pattern transferred to the resist underlayer film. Alternatively, a pattern-transferred resist underlayer film is used, the organic underlayer film of the underlayer thereof is dry etched with an oxygen-containing gas, the pattern is transferred to the organic underlayer film, and the substrate is processed using a halogen-containing gas at the pattern-transferred organic underlayer film.

According to the present invention, the resist underlayer film functions as a hard mask, the hydrolyzable group such as the alkoxy group, acyloxy group, or halogen atom in the structure of Formula (1) is hydrolyzed to partially hydrolyzed, and then a polymer with a polysiloxane structure is formed by a condensation reaction of the silanol group. Such polyorganosiloxane structure functions sufficiently as a hard mask.

The polyorganosiloxane structure (intermediate film) is effective as a hard mask for etching the organic underlayer film present therebelow or for processing (etching) the substrate. Thus, the intermediate film demonstrates sufficient dry etching resistance with respect to an oxygen-containing dry etching gas of the organic underlayer film or during substrate processing.

The resist underlayer film according to the present invention increases the dry etching rate of those upper-layer resists and imparts the resistance to dry etching when the substrate is processed.

The resist underlayer film composed of the composition for forming a resist underlayer film according to the present invention is formed to include a silane having a 1-3 diketone structure, an enol structure which is an isomer of the diketone structure, a 1-3 keto ester structure, and a 1-3 diester structure. Those are structures including at least a 1-3 diketone, and such a structure should be included. Because of the presence of such structures, the synergetic effect with the resist film in the upper layer prevents the pattern shape from footing and a straight pattern shape can be obtained. This is apparently due to the degree of acidity of the hydrogen atom which presents at the a position of the 1-3 diketone structure. The importance of having such a degree of acidity is apparently demonstrated in the effect produced when the resist in the upper layer is exposed.

The pattern shape is improved because of such high degree of acidity (pKa value is low). However, where the degree of acidity is too high, the composition for forming a resist underlayer film undergoes gelling, which is undesirable.

Further, such an organic group having at least the 1-3 diketone structure should be incorporated in a polymer, and in order to be incorporated in a polymer, it is preferably included as an organic group of a hydrolyzable silane. By incorporating the organic group in a polymer, the group can be prevented from being burned out during baking in the process of forming the underlayer film.

The constitution of the composition according to the present invention will be explained below.

The present invention relates to a composition for forming a lithographic resist underlayer film comprising, as a silane, a hydrolyzable organosilane, a hydrolysate thereof, or a hydrolytic condensate thereof, the silane including the hydrolyzable organosilane of Formula (1) below.

The ratio of the partial structure of Formula (2) to the silicon atoms in the entire silane is less than 50 mol %, for example, 0.5 mol % to 30 mol %, 0.5 mol % to 25 mol %, 0.5 mol % to 15 mol %, or 0.5 mol % to 10 mol %.

The composition for forming a resist underlayer film according to the present invention includes the hydrolyzable organosilane of Formula (1), a hydrolysate thereof, or a hydrolytic condensate thereof, and a solvent. An acid, water, an alcohol, a curing catalyst, an acid generator, other organic polymers, a light-absorbing compound, and a surfactant can be included as optional components.

The solid content in the composition for forming a resist underlayer film according to the present invention takes, for example, 0.1% by mass to 50% by mass, 0.1% by mass to 30% by mass, or 0.1% by mass to 25% by mass. The solid content as referred to herein is a content obtained by removing a solvent component from all the components of the composition for forming a resist underlayer film.

The ratio of the hydrolyzable organosilane, hydrolysate thereof, or hydrolytic condensate thereof in the solid content is equal to or higher than 20% by mass, for example, 50% by mass to 100% by mass, 60% by mass to 100% by mass, or 70% by mass to 100% by mass.

The hydrolyzable organosilane used according to the present invention has a structure of Formula (1).

$R^3$ in Formula (1) is a group of Formula (2), (3), or (4). Each $R^1$ in Formula (1) is independently an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof. Each $R^2$ is independently an alkoxy group, an acyloxy group, or a halogen atom. a is integer of 0 to 2, and b is integer of 1 to 3.

In each of Formulae (2), (3), and (4), at least one from among $R^4$, $R^5$, and $R^6$ is a group bonded to the silicon atom by a single bond or as a linking group. When $R^4$ is not bonded to the silicon atom, $R^4$ is a hydrogen atom, or an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof. When $R^5$ and $R^6$ are not bonded to the silicon atom, each of $R^5$ and $R^6$ is independently a linear alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof. When any of $R^4$, $R^5$ or $R^6$ is a group bonded to the silicon atom by a linking group, the group bonded to the silicon atom is a divalent group obtained by removing one hydrogen atom from the respective group defined above. However, when $R^6$ in Formula (3), $R^5$ in Formula (4), and $R^6$ in Formula (4) are bonded to the silicon atom, they are groups bonded to the silicon atom by a linking group, rather than by a single bond.

A divalent organic group corresponding to an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof can be used as the linking group.

The alkyl group is a linear or branched $C_{1-10}$ alkyl group, such as methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group. Further, a cyclic alkyl group can be also used. Examples of $C_{1-10}$ cyclic alkyl groups include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, a 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The linear alkyl group is a $C_{1-10}$ alkyl group, for example, methyl group, ethyl group, n-propyl group, n-butyl group, n-pentyl group, and n-hexyl group.

Examples of the aryl group include $C_{6-20}$ aryl groups such as phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, p-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

The alkenyl group is a $C_{2-10}$ alkenyl group, for example, ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

An aralkyl group is an alkyl group substituted with an aryl group, and examples thereof include phenyl-substituted $C_{1-10}$ alkyls. Specific examples include benzyl group, ethylphenyl group, propylphenyl group, and butylphenyl group.

Other examples include the aforementioned organic groups substituted with a halogen atom such as fluorine, chlorine, bromine and iodine.

Examples of the organic group having an epoxy group include glycidoxymethyl group, glycidoxyethyl group, glycidoxypropyl group, glycidoxybutyl group, and epoxycyclohexyl group.

Examples of the organic group having an acryloyl group include acryloylmethyl group, acryloylethyl group, and acryloylpropyl group.

Examples of the organic group having a methacryloyl group include methacryloylmethyl group, methacryloylethyl group, and methacryloylpropyl group.

Examples of the organic group having a mercapto group include ethylmercapto group, butylmercapto group, hexylmercapto group, and octylmercapto group.

Examples of the organic group having a cyano group include cyanoethyl group and cyanopropyl group.

Examples of the organic group having a sulfonyl group include methylsulfonyl group, allylsulfonyl group, and phenylsulfonyl group.

Examples of the alkoxy group in Formula (1) include $C_{1-20}$ alkoxy groups, more specifically, alkoxy groups with a $C_{1-20}$ linear, branched, and cyclic alkyl portion, for example, methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trim ethyl-n-propoxy group, 1-ethyl-1-methyl-n-propoxy group, and 1-ethyl-2-methyl-n-propoxy group. Examples of cyclic alkoxy groups include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

Examples of the acyloxy group in Formula (1) include a $C_{2-20}$ acyloxy group, for example, methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the halogen atom in Formula (1) include fluorine, chlorine, bromine, and iodine.

The hydrolyzable organosilane of Formula (1) having pKa within a range of 8.00 to 20.00 or 8.00 to 13.00 can be used. When the pKa is equal to or less than 8.00, the degree of acidity is too high and the stability is low. When the pKa is greater than 20.00, a good resist pattern cannot be formed in the lithographic process.

Examples of the structure of Formula (2) in the hydrolyzable organosilane of Formula (1) are presented below.

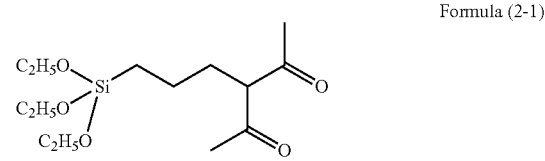

Formula (2-1)

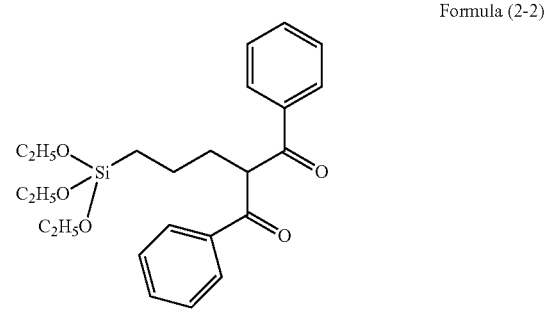

Formula (2-2)

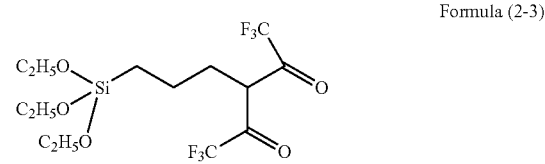

Formula (2-3)

-continued
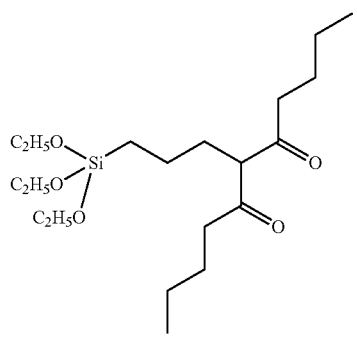
Formula (2-4)
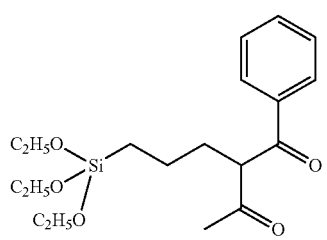
Formula (2-5)
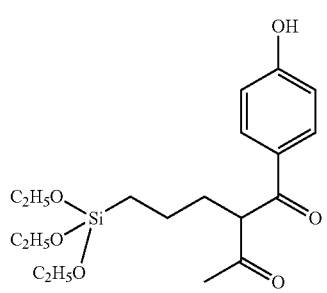
Formula (2-6)
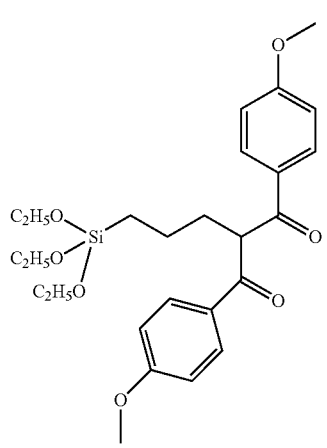
Formula (2-7)
-continued
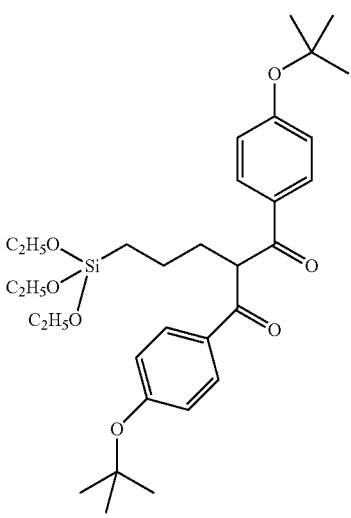
Formula (2-8)
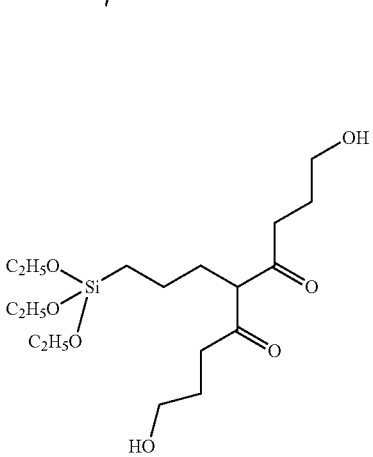
Formula (2-9)
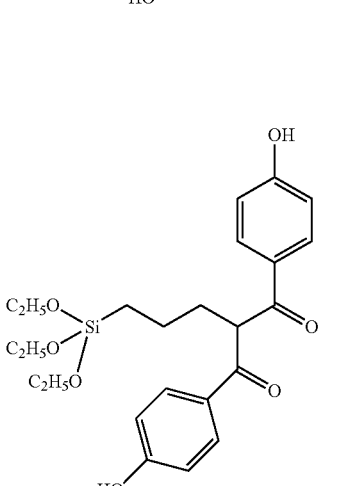
Formula (2-10)
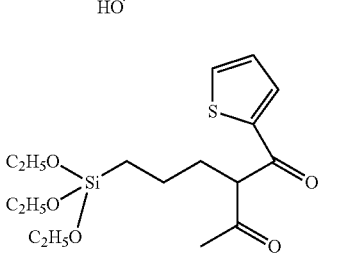
Formula (2-11)

Formula (2-12)
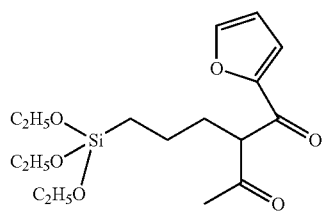
Formula (2-13)
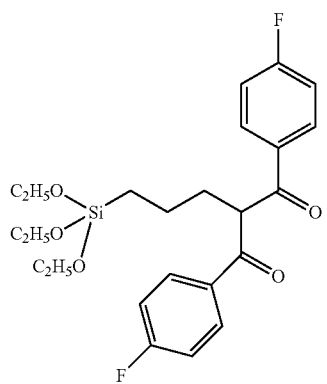
Formula (2-14)
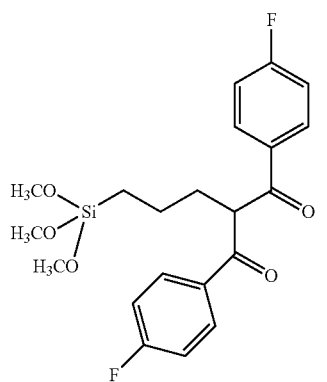
In the hydrolyzable organosilane of Formula (1), a keto form having a structure of Formula (2) which presents as an isomer form and an enol thereof can be also used.
Formula (2-1-1)
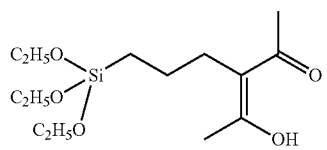
Formula (2-2-1)
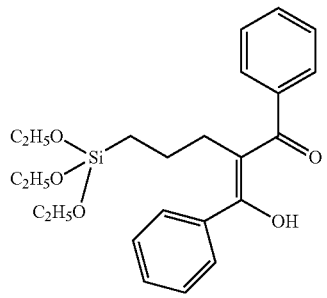
Formula (2-3-1)
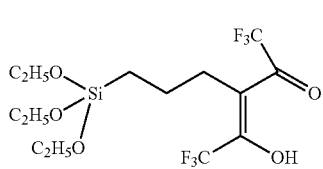
Formula (2-4-1)
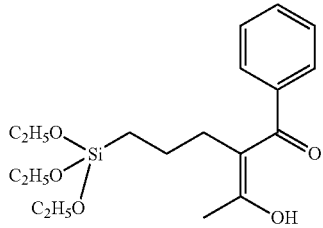
Formula (2-5-1)
Formula (2-6-1)
Formula (2-7-1)
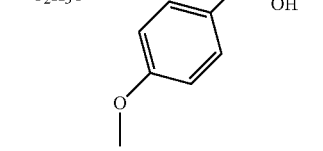

Formula (2-8-1)
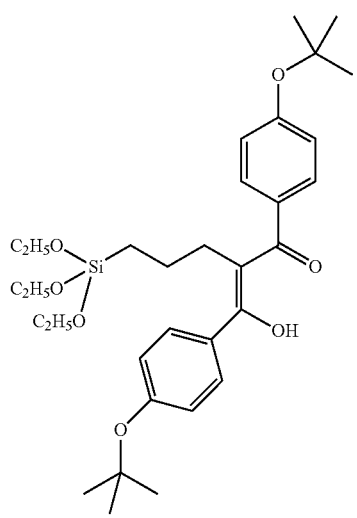
Formula (2-9-1)
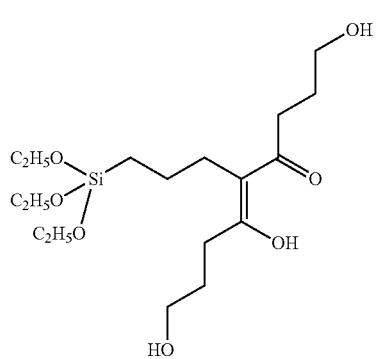
Formula (2-10-1)
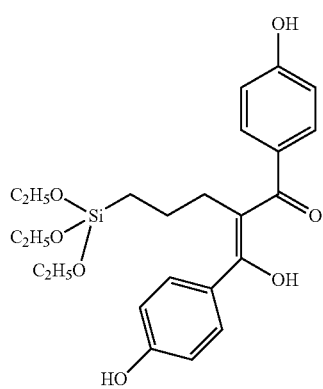
Formula (2-11-1)
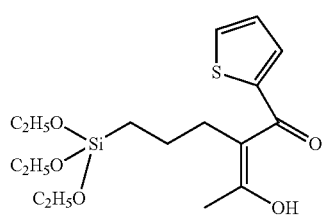
Formula (2-12-1)
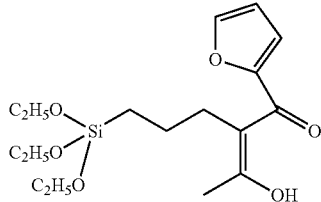
Formula (2-13-1)
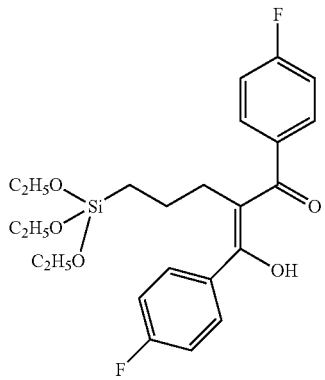
Formula (2-14-1)
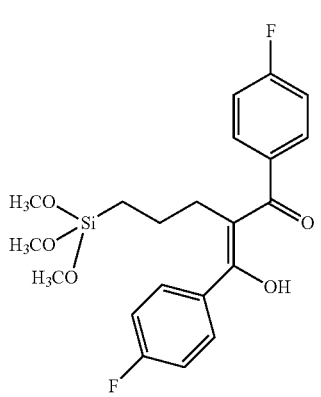
Examples of the structure of Formula (3) in the hydrolyzable organosilane of Formula (1) are presented below.
Formula (3-1)
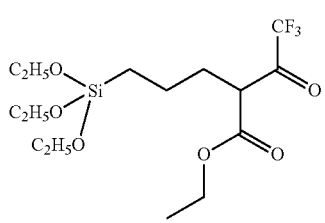
Formula (3-2)
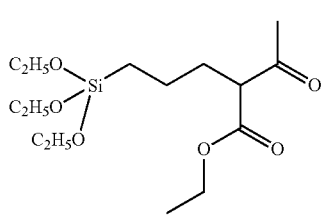

-continued
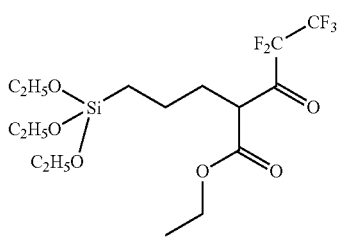
Formula (3-3)
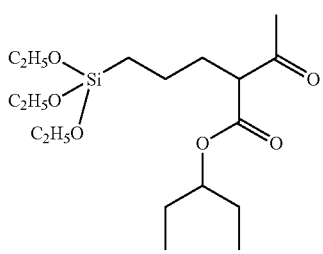
Formula (3-4)
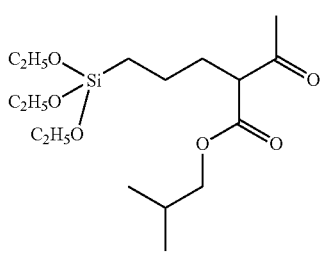
Formula (3-5)
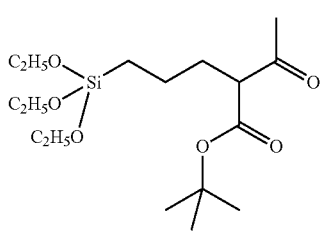
Formula (3-6)
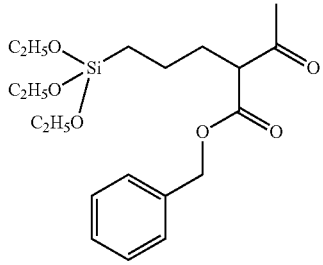
Formula (3-7)
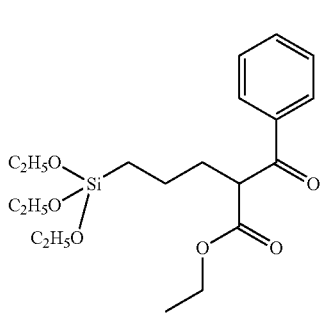
Formula (3-8)
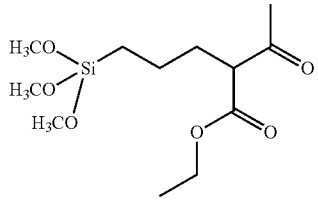
Formula (3-9)
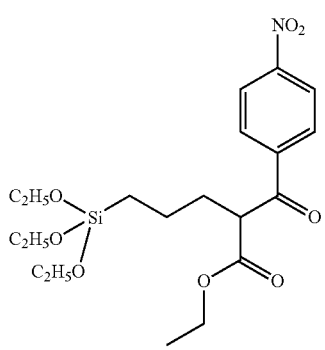
Formula (3-10)
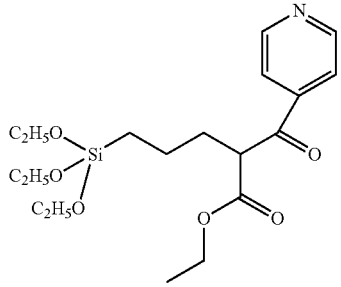
Formula (3-11)
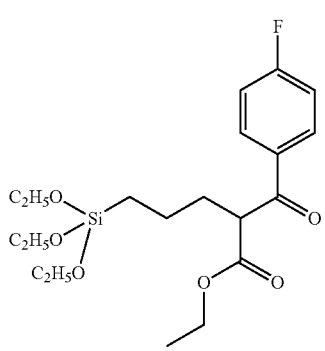
Formula (3-12)
Examples of the structure of Formula (4) in the hydrolyzable organosilane of Formula (1) are presented below.
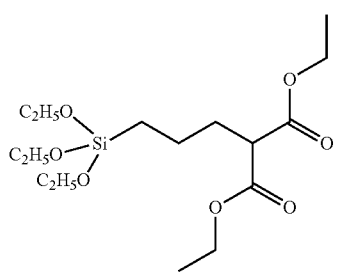
Formula (4-1)

Formula (4-2)

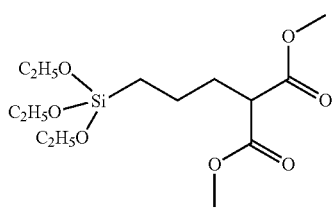

Formula (4-3)

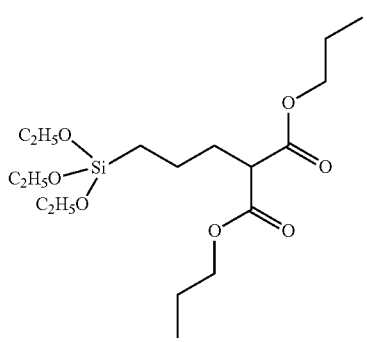

Formula (4-4)

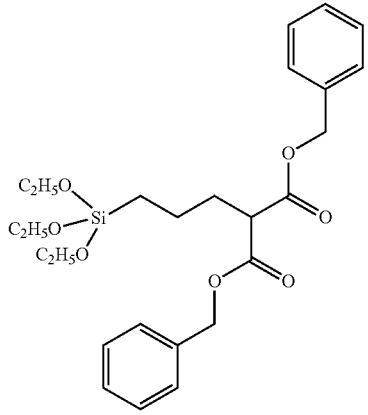

Formula (4-5)

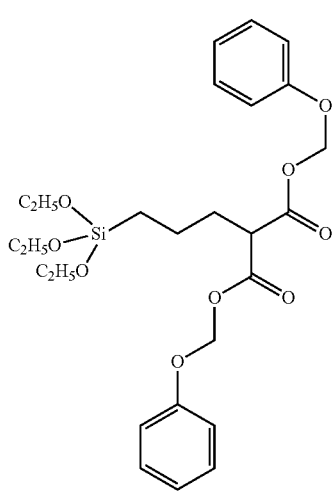

Formula (4-6)

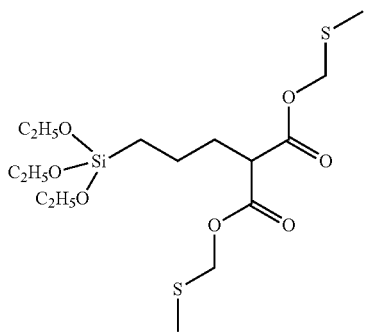

Formula (4-7)

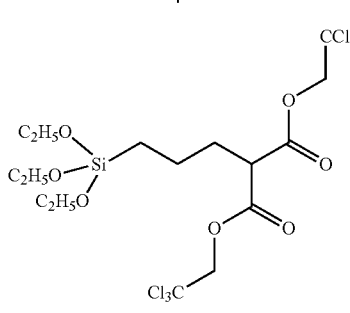

Formula (4-8)

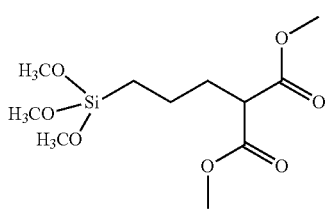

According to the present invention, a combination of at least one organosilicon compound selected from a group consisting of the organosilicon compound of Formula (5) and the organosilicon compound of Formula (6), and the hydrolyzable organosilane of Formula (1), hydrolysates thereof, or hydrolytic condensates thereof can be included.

Further, according to the present invention, a hydrolytic condensate of the hydrolyzable organosilane of Formula (1), or a hydrolytic condensate of the hydrolyzable organosilane of Formula (1) and the organosilicon compound of Formula (5) can be used.

According to the present invention, the hydrolyzable organosilane of Formula (1) can be used together with the organosilicon compound of Formula (5).

Thus, the hydrolyzable organosilane of Formula (1), a hydrolysate thereof, or a hydrolytic condensate thereof can be used together with the organosilicon compound of Formula (5), a hydrolysate thereof, or a hydrolytic condensate thereof.

The hydrolyzable organosilane of Formula (1) and the organosilicon compound of Formula (5) can be used at a molar ratio thereof within a range of 1:0 to 1:200. In order to obtain a good resist shape, the hydrolyzable organosilane of Formula (1) and the organosilicon compound of Formula (5) can be used at a molar ratio thereof within a range of 1:199 to 1:2.

Those compounds are preferably used as hydrolytic condensates (polyorganosiloxane polymers), and it is preferred that a hydrolytic condensate (polyorganosiloxane polymer) of the hydrolyzable organosilane of Formula (1) and the organosilicon compound of Formula (5) are used.

Each $R^1$ in the organosilicon compound of Formula (5) is independently an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an alkoxyaryl group, an acyloxyaryl group, or a cyano group, or a combination thereof, and is a group bonded to the silicon atom by a Si—C bond; $R^2$ is an alkoxy group, an acyloxy group, or a halogen atom; a is integer of 0 to 3.

Examples of the alkyl group, aryl group, aralkyl group, alkyl halide group, aryl halide group, aralkyl halide group, alkenyl group, the organic group having an epoxy group, an acryloyl group, a methacryloyl group, a mercapto group, a sulfonamide group, or a cyano group, and also the alkoxy group, acyloxy group, or halogen atom contained in the hydrolyzable group, which are represented by $R^1$ and $R^2$, include those described in relation to Formula (1) above.

Examples of the organosilicon compound of Formula (5) include tetramethoxysilane, tetrachlorosilane, tetraacetoxysilane, tetraethoxysilane, tetra-n-propoxysilane, tetraisopropoxysilane, tetra-n-butoxysilane, tetraacetoxysilane, methyltrimethoxysilane, methyltriethoxysilane, methyltrichlorosilane, methyltriacetoxysilane, methyltripropoxysilane, methyltriacetyxysilane, methyltributoxysilane, methyltripropoxysilane, methyltriamiloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, β-glycidoxypropyltributoxysilane, γ-glycidoxypropyltriphenoxysilane, α-glycidoxybutyltriethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl) propyltrimethoxysilane γ-(3,4-epoxycyclohexyl) propyltriethoxysilane δ-(3,4-epoxycyclohexyl) butyltrimethoxysilane δ-(3,4-epoxycyclohexyl) butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γglycidoxypropylmethyldimethoxysilane, γ-glycidoxypropylmethyldiethoxysilane, γ-glycidoxypropylmethyldipropoxysilane γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, phenyltrimethoxysilane, phenyltrichlorosilane, phenyltriacetoxysilane, phenyltriethoxysilane, phenyltriacetoxysilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, methylvinyldiethoxysilane, phenylsulfonylaminopropyltriethoxysilane, methylsulfonylaminopropyltriethoxysilane, phenylsulfonylaminopropyltrimethoxysilane, and methylsulfonylaminopropyltrimethoxysilane.

$R^1$ of the organosilicon compound of Formula (6) is an alkyl group, each $R^2$ is independently an alkoxy group, an acyloxy group, or a halogen atom, Y is an alkylene group or an arylene group, b is integer of 0 or 1, and c is integer of 0 or 1.

Formula (6) represents an organosilicon compound in which two silicon atoms are bonded by a single bond when b is 0, and represents an organosilicon compound in which two silicon atoms are bonded by an alkylene group or an arylene group when b is 1.

Examples of the alkyl group, alkoxy group, acyloxy group, and halogen atom include those described in relation to Formula (1) above. Examples of the alkylene group and arylene group include divalent organic groups corresponding to the alkyl group and aryl group described above.

Specific examples of the hydrolytic condensate of the hydrolyzable organosilane of Formula (1) and the organosilicon compound of Formula (5) are presented below.

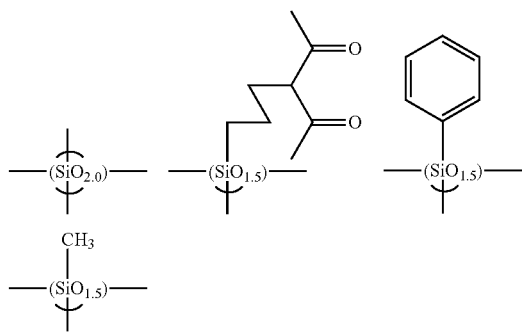

Formula (5-1)

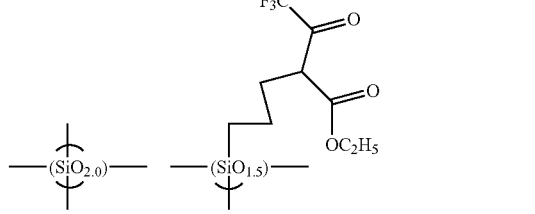

Formula (5-2)

-continued
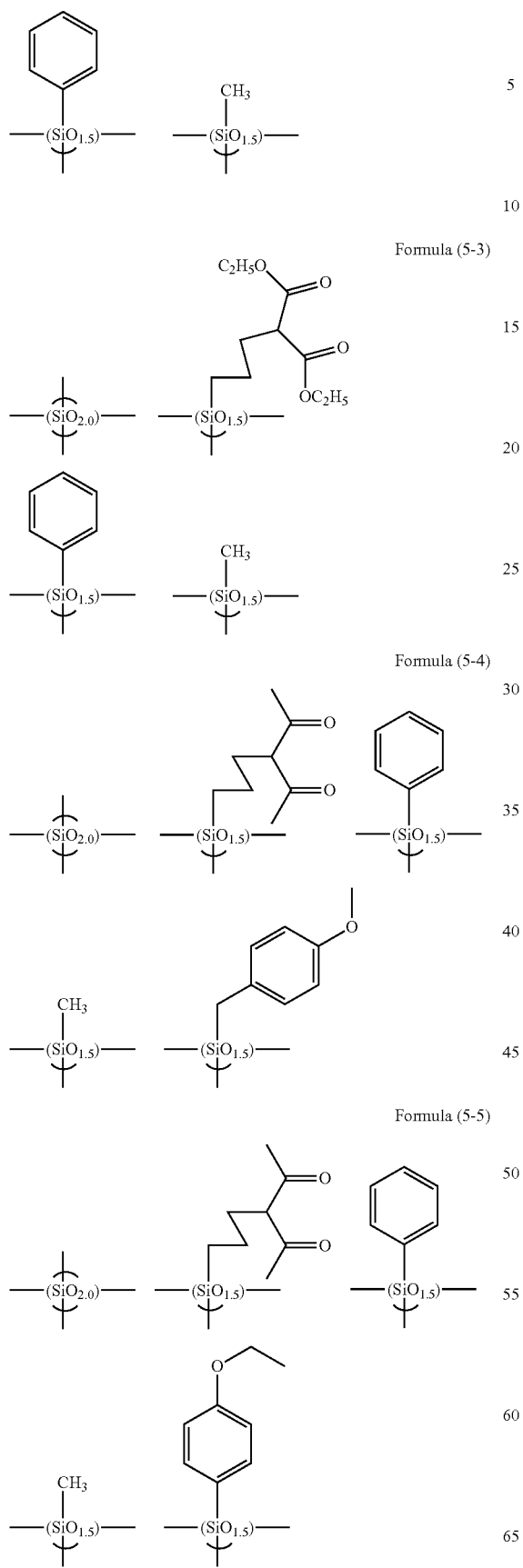
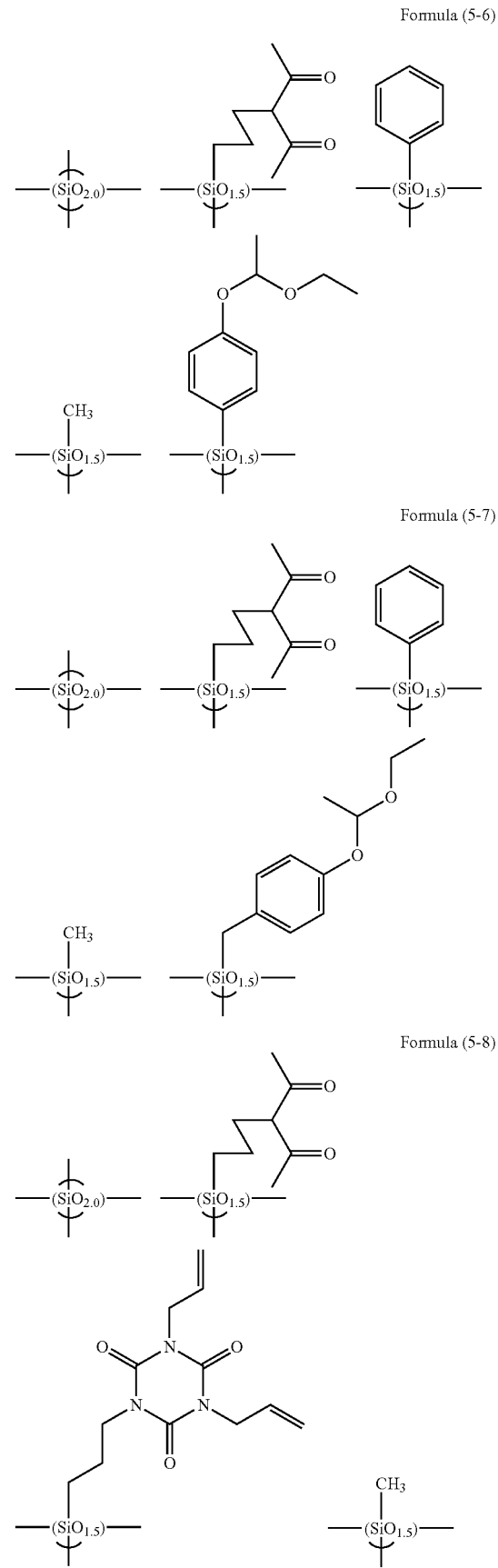

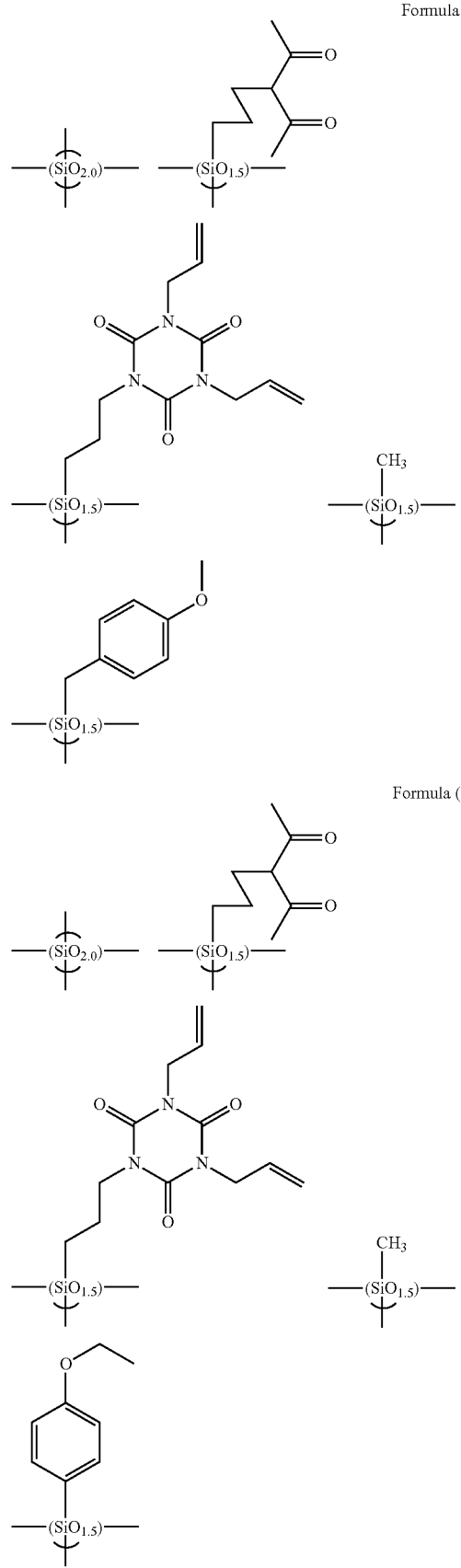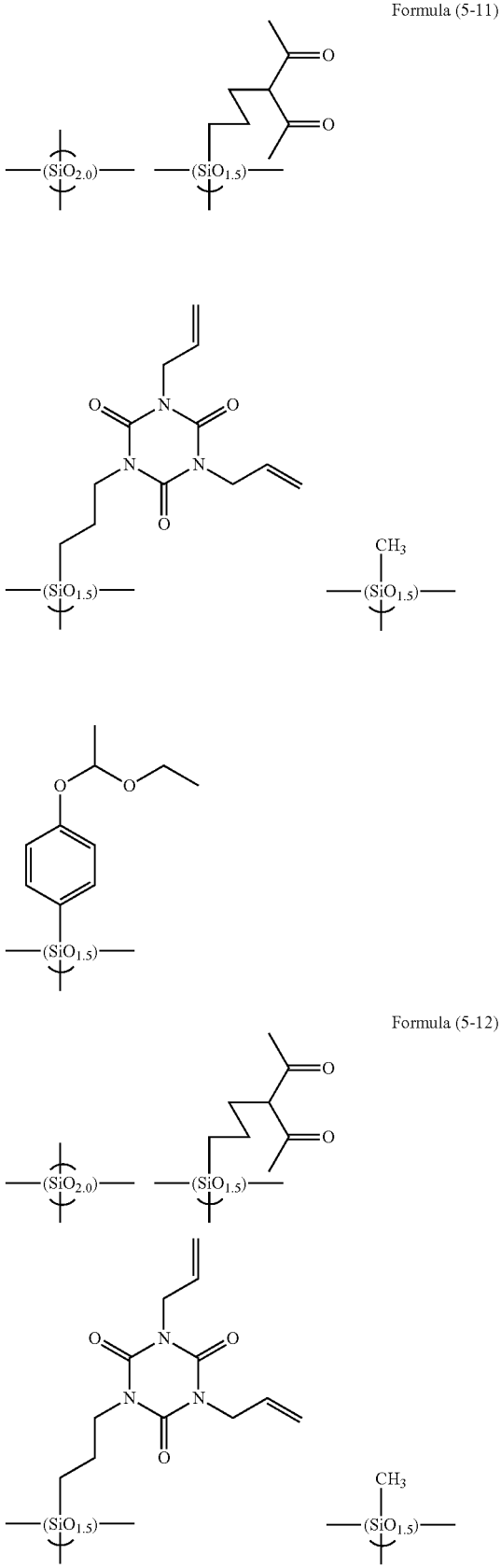

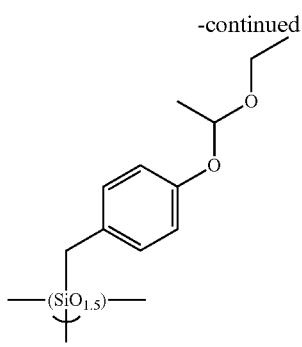

The hydrolytic condensate (polyorganosiloxane) of the hydrolyzable organosilane of Formula (1), or the hydrolytic condensate (polyorganosiloxane) of the hydrolyzable organosilane of Formula (1) and the organosilicon compound of Formula (5) and/or Formula (6) makes it possible to obtain a condensate with a weight-average molecular weight of 1000 to 1,000,000 or 1000 to 100,000. These molecular weights are obtained (calculated as polystyrene) by GPC analysis.

For example, devices and conditions for GPC measurement are as follows. GPC device: HLC-8220GPC (trade name) manufactured by Tosoh Corp; GPC column: Shodex KF803L, KF802, KF801 (trade names) manufactured by Showa Denko KK); column temperature: 40° C.; eluent (eluting solvent): tetrahydrofuran; flow rate (flow velocity): 1.0 ml/min; and standard sample: polystyrene (manufactured by Showa Denko KK).

In the hydrolysis of the alkoxysilyl group, acyloxysilyl group, or silyl halide group, water is used at 0.5 mol to 100 mol, preferably 1 mol to 10 mol, per 1 mol of the hydrolyzable group.

A hydrolysis catalyst can be used at 0.001 mol to 10 mol, preferably 0.001 mol to 1 mol, per 1 mol of the hydrolyzable group.

The reaction temperature during hydrolysis and condensation is usually 20° C. to 80° C.

The hydrolysis may be complete or partial. Thus, a hydrolysate or a monomer may remain in the hydrolytic condensate. A catalyst can be used during hydrolysis and condensation.

Examples of the hydrolysis catalyst include a metal chelate compound, an organic acid, an inorganic acid, an organic base, and an inorganic base.

Examples of metal chelate compounds as the hydrolysis catalyst include titanium chelate compounds such as triethoxy-mono(acetylacetonato)titanium, tri-n-propoxy-mono(acetylacetonato)titanium, tri-i-propoxy-mono(acetylacetonato)titanium, tri-n-butoxy-mono(acetylacetonato)titanium, tri-sec-butoxy-mono(acetylacetonato)titanium, tri-t-butoxy-mono(acetylacetonato)titanium, diethoxy-bis(acetylacetonato)titanium, di-n-propoxy-bis(acetylacetonato)titanium, di-1-propoxy-bis(acetylacetonato)titanium, di-n-butoxy-bis(acetylacetonato)titanium, di-sec-butoxy-bis(acetylacetonato)titanium, di-t-butoxy-bis(acetylacetonato)titanium, monoethoxy-tris(acetylacetonato)titanium, mono-n-propoxy-tris(acetylacetonato)titanium, mono-1-propoxy-tris(acetylacetonato)titanium, mono-n-butoxy-tris(acetylacetonato)titanium, mono-sec-butoxy-tris(acetylacetonato)titanium, mono-t-butoxy-tris(acetylacetonato)titanium, tetrakis(acetylacetonato)titanium, triethoxy-mono(ethylacetoacetate)titanium, tri-n-propoxy-mono(ethylacetoacetate)titanium, tri-i-propoxy-mono(ethylacetoacetate)titanium, tri-n-butoxy-mono(ethylacetoacetate)titanium, tri-sec-butoxy-mono(ethylacetoacetate)titanium, tri-t-butoxy-mono(ethylacetoacetate)titanium, diethoxy-bis(ethylacetoacetate)titanium, di-n-propoxy-bis(ethylacetoacetate)titanium, di-i-propoxy-bis(ethylacetoacetate)titanium, di-n-butoxy-bis(ethylacetoacetate)titanium, di-sec-butoxy-bis(ethylacetoacetate)titanium, di-t-butoxy-bis(ethylacetoacetate)titanium, monoethoxy-tris(ethylacetoacetate)titanium, mono-n-propoxy-tris(ethylacetoacetate)titanium, mono-i-propoxy-tris(ethylacetoacetate)titanium, mono-n-butoxy-tris(ethylacetoacetate)titanium, mono-sec-butoxy-tris(ethylacetoacetate)titanium, mono-t-butoxy-tris(ethylacetoacetate)titanium, tetrakis(ethylacetoacetate)titanium, mono-(acetylacetonato)tris(ethylacetoacetate)titanium, bis(acetylacetonato)bis(ethylacetoacetate)titanium, and tris(acetylacetonato)mono(ethylacetoacetate)titanium; zirconium chelate compounds such as triethoxy-mono(acetylacetonato)zirconium, tri-n-propoxy-mono(acetylacetonato)zirconium, tri-i-propoxy-mono(acetylacetonato)zirconium, tri-n-butoxy-mono(acetylacetonato)zirconium, tri-sec-butoxy-mono(acetylacetonato)zirconium, tri-t-butoxy-mono(acetylacetonato)zirconium, diethoxy-bis(acetylacetonato)zirconium, di-n-propoxy-bis(acetylacetonato)zirconium, di-i-propoxy-bis(acetylacetonato)zirconium, di-n-butoxy-bis(acetylacetonato)zirconium, di-sec-butoxy-bis(acetylacetonato)zirconium, di-t-butoxy-bis(acetylacetonato)zirconium, monoethoxy-tris(acetylacetonato)zirconium, mono-n-propoxy-tris(acetylacetonato)zirconium, mono-i-propoxy-tris(acetylacetonato)zirconium, mono-n-butoxy-tris(acetylacetonato)zirconium, mono-sec-butoxy-tris(acetylacetonato)zirconium, mono-t-butoxy-tris(acetylacetonato)zirconium, tetrakis(acetylacetonato)zirconium, triethoxy-mono(ethylacetoacetate)zirconium, tri-n-propoxy-mono(ethylacetoacetate)zirconium, tri-i-propoxy-mono(ethylacetoacetate)zirconium, tri-n-butoxy-mono(ethylacetoacetate)zirconium, tri-sec-butoxy-mono(ethylacetoacetate)zirconium, tri-t-butoxy-mono(ethylacetoacetate)zirconium, diethoxy-bis(ethylacetoacetate)zirconium, di-n-propoxy-bis(ethylacetoacetate)zirconium, di-i-propoxy-bis(ethylacetoacetate)zirconium, di-n-butoxy-bis(ethylacetoacetate)zirconium, di-sec-butoxy-bis(ethylacetoacetate)zirconium, di-t-butoxy-bis(ethylacetoacetate)zirconium, monoethoxy-tris(ethylacetoacetate)zirconium, mono-n-propoxy-tris(ethylacetoacetate)zirconium, mono-i-propoxy-tris(ethylacetoacetate)zirconium, mono-n-butoxy-tris(ethylacetoacetate)zirconium, mono-sec-butoxy-tris(ethylacetoacetate)zirconium, mono-t-butoxy-tris(ethylacetoacetate)zirconium, tetrakis(ethylacetoacetate)zirconium, mono(acetylacetonato)tris(ethylacetoacetate)zirconium, bis(acetylacetonato)bis(ethylacetoacetate)zirconium, and tris(acetylacetonato)mono(ethylacetoacetate)zirconium; and aluminum chelate compounds such as tris(acetylacetonato)aluminum and tris(ethylacetoacetate)aluminum.

Examples of organic acids as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of inorganic acids as the hydrolysis catalyst include hydrochloric acid, nitric acid, sulfuric acid, hydrofluoric acid and phosphoric acid.

Examples of organic bases as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene and tetramethylammonium hydroxide. Examples of inorganic bases include ammonia, sodium hydroxide, potassium hydroxide, barium hydroxide and calcium hydroxide. Of these catalysts, the metal chelate compounds, the organic acids and the inorganic acids are preferred, and those may be used either individually or in combinations of two or more thereof.

Examples of organic solvents used for the hydrolysis include aliphatic hydrocarbon solvents such as n-pentane, i-pentane, n-hexane, i-hexane, n-heptane, i-heptane, 2,2,4-trimethylpentane, n-octane, i-octane, cyclohexane and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene and trimethylbenzene; monohydric alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol and cresol; polyhydric alcohol solvents such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol and glycerol; ketone solvents such as acetone, methyl ethyl ketone, methyl-n-propyl ketone, methyl-n-butyl ketone, diethyl ketone, methyl-1-butyl ketone, methyl-n-pentyl ketone, ethyl-n-butyl ketone, methyl-n-hexyl ketone, di-1-butyl ketone, trimethylnonanone, cyclohexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethyl hexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethylacetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane and 1,3-propanesultone. Those solvents may be used either individually or in combinations of two or more thereof.

From the standpoint of stability of solutions in storage, the ketone solvents such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone (1,1,3-trimethyl-2-norbornene) are preferred.

The composition for forming a resist underlayer film according to the present invention can include a curing catalyst. The curing catalyst acts when the coating film including the polyorganosilioxane constituted by the hydrolytic condensate is heated and cured.

An ammonium salt, a phosphine, a phosphonium salt, and a sulfonium salt, can be used as the curing catalyst.

Examples of the ammonium salt include a quaternary ammonium salt having a structure of Formula (D-1)

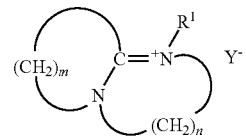

Formula (D-1)

(where m is integer of 2 to 11, n is integer of 2 or 3, $R^1$ is an alkyl group or an aryl group, and $Y^-$ is an anion), a quaternary ammonium salt having a structure of Formula (D-2)

$$R^2R^3R^4R^5N^+Y^-$$ Formula (D-2)

(where $R^2$, $R^3$, $R^4$, and $R^5$ are each an alkyl group or an aryl group, N is a nitrogen atom, $Y^-$ is an anion, and $R^2$, $R^3$, $R^4$, and $R^5$ are each bonded to the nitrogen atom by a C—N bond), a quaternary ammonium salt having a structure of Formula (D-3)

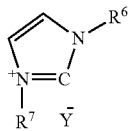

Formula (D-3)

(where $R^6$ and $R^7$ are each an alkyl group or an aryl group and $Y^-$ is an anion),
a quaternary ammonium salt having a structure of Formula (D-4)

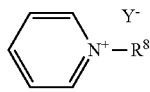

Formula (D-4)

(where $R^8$ is an alkyl group or an aryl group and $Y^-$ is an anion),
a quaternary ammonium salt having a structure of Formula (D-5)

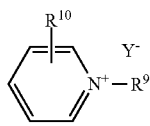

Formula (D-5)

(where $R^9$ and $R^{10}$ are each an alkyl group or an aryl group and $Y^-$ is an anion), and
a tertiary ammonium salt having a structure of Formula (D-6)

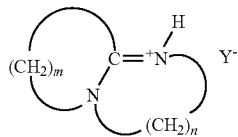

Formula (D-6)

(where m is integer of 2 to 11, n is integer of 2 or 3, H is a hydrogen atom, and $Y^-$ is an anion).

Examples of the phosphonium salt include a quaternary phosphonium salt of Formula (D-7)

$$R^{11}R^{12}R^{13}R^{14}P^+Y^- \quad \text{Formula (D-7)}$$

(where $R^{11}$, $R^{12}$, $R^{13}$, and $R^{14}$ are each an alkyl group or an aryl group, P is a phosphorus, atom, $Y^-$ is an anion, and $R^{11}$, $R^{12}$, $R^{13}$ and $R^{14}$ are each bonded to the phosphorus atom by a C—P bond).

Examples of the sulfonium salt include a tertiary sulfonium salt of Formula (D-8)

$$R^{15}R^{16}R^{17}S^+Y^- \quad \text{Formula (D-8)}$$

(where $R^{15}$, $R^{16}$, and $R^{17}$ are each an alkyl group or an aryl group, S is a sulfur atom, $Y^-$ is an anion, and $R^{15}$, $R^{16}$, and $R^{17}$ are each bonded to the sulfur atom by a C—S bond).

The compound of Formula (D-1) above is a quaternary ammonium salt derived from an amine, m is integer of 2 to 11 and n is integer of 2 or 3. $R^1$ of the quaternary ammonium salt is a $C_{1-18}$, preferably $C_{2-10}$, alkyl group or aryl group, for example, a linear alkyl group such as ethyl group, propyl group, and butyl group, or benzyl group, cyclohexyl group, cyclohexylmethyl group, and dicyclopentadienyl group. Examples of the anion ($Y^-$) include a halogen ion such as chlorine ion ($Cl^-$), bromine ion ($Br^-$), and iodine ion ($I^-$), and an acid group such as carboxylate (—$COO^-$), sulfonate (—$SO_3^-$), and alcoholate (—$O^-$).

The compound of Formula (D-2) above is a quaternary ammonium salt of $R^2R^3R^4R^5N^+Y^-$. $R^2$, $R^3$, $R^4$, and $R^5$ of the quaternary ammonium salt are each a $C_{1-18}$ alkyl group or aryl group, or a silane compound bonded by a Si—C bond to the silicon atom. Examples of the anion ($Y^-$) include a halogen ion such as chlorine ion ($Cl^-$), bromine ion ($Br^-$), and iodine ion ($I^-$), and an acid group such as carboxylate (—$COO^-$), sulfonate (—$SO_3^-$), and alcoholate (—$O^-$). This quaternary ammonium salt can be purchased as a commercial product, and specific examples thereof include tetramethyl ammonium acetate, tetrabutyl ammonium acetate, triethylbenzyl ammonium chloride, triethylbenzyl ammonium bromide, trioctylmethyl ammonium chloride, tributylbenzyl ammonium chloride, and trimethylbenzyl ammonium chloride.

The compound of Formula (D-3) above is a quaternary ammonium salt derived from a 1-substituted imidazole. $R^6$ and $R^7$ have 1 to 18 carbon atoms, and it is preferred that the sum total of carbon atoms in $R^6$ and $R^7$ be equal to or greater than 7. Examples of $R^6$ include methyl group, ethyl group, propyl group, phenyl group, and benzyl group, and examples of $R^7$ include benzyl group, octyl group, and octadecyl group. Examples of the anion ($Y^-$) include a halogen ion such as chlorine ion ($Cl^-$), bromine ion ($Br^-$), and iodine ion ($I^-$), and an acid group such as carboxylate (—$COO^-$), sulfonate (—$SO_3^-$), and alcoholate (—$O^-$). This compound can be also purchased as a commercial product, and also can be produced, for example, by a reaction of an imidazole compound such as 1-methylimidazole or 1-benzylimidazole and an alkyl halide such as benzyl bromide and methyl bromide, or an aryl halide.

The compound of Formula (D-4) above is a quaternary ammonium salt derived from pyridine. $R^8$ is a $C_{1-18}$, preferably $C_{4-18}$, alkyl group or aryl group, for example, butyl group, octyl group, benzyl group, and lauryl group. Examples of the anion ($Y^-$) include a halogen ion such as chlorine ion ($Cl^-$), bromine ion ($Br^-$), and iodine ion ($I^-$) and an acid group such as carboxylate (—$COO^-$), sulfonate (—$SO_3^-$), and alcoholate (—$O^-$). This compound can be also purchased as a commercial product, and also can be produced, for example, by a reaction of pyridine with an alkyl halide such as lauryl chloride, benzyl chloride, benzyl bromide, methyl bromide, and octyl bromide or an aryl halide. Examples of such compound include N-lauryl pyridinium chloride and N-benzyl pyridinium bromide.

The compound of Formula (D-5) above is a quaternary ammonium salt derived from substituted pyridine such as picoline. $R^9$ is a $C_{1-18}$, preferably $C_{4-18}$, alkyl group or aryl group, for example, methyl group, octyl group, lauryl group, and benzyl group. $R^{10}$ is a $C_{1-18}$ alkyl group or aryl group. For example, in the case of a quaternary ammonium salt derived from picoline, $R^{10}$ is a methyl group. Examples of the anion ($Y^-$) include a halogen ion such as chlorine ion ($Cl^-$), bromine ion ($Br^-$), and iodine ion ($I^-$), and an acid group such as carboxylate (—$COO^-$), sulfonate (—$SO_3^-$), and alcoholate (—$O^-$). This compound can be also purchased as a commercial product, and also can be produced, for example, by a reaction of substituted pyridine such as picoline with an alkyl halide such as methyl bromide, octyl bromide, lauryl chloride, benzyl chloride, and benzyl bromide, or an aryl halide.

Examples of such compound include N-benzyl picolinium chloride, N-benzyl picolinium bromide, and N-lauryl picolinium chloride.

The compound of Formula (D-6) above is a tertiary ammonium salt derived from an amine; m is integer of 2 to 11 and n is integer of 2 or 3. Examples of the anion ($Y^-$) include a halogen ion such as chlorine ion ($Cl^-$), bromine ion ($Br^-$), and iodine ion ($I^-$), and an acid group such as carboxylate (—$COO^-$), sulfonate (—$SO_3^-$), and alcoholate (—$O^-$). This compound can be produced by a reaction of an amine and a weak acid such as a carboxylic acid or a phenol. Examples of the carboxylic acid include formic acid and acetic acid. When formic acid is used, the anion ($Y^-$) is ($HCOO^-$), when acetic acid is used, the anion ($Y^-$) is ($CH_3COO^-$), and when phenol is used, the anion ($Y^-$) is ($C_6H_5O^-$).

The compound of Formula (D-7) above is a quaternary phosphonium salt having a structure of $R^{11}R^{12}R^{13}R^{14}P^+Y^-$. $R^{11}$, $R^{12}$, $R^{13}$, and $R^{14}$ are each a $C_{1-18}$ alkyl group or aryl group, or a silane compound bonded by a Si—C bond to the silicon atom. It is preferred that three of the four substitution groups of $R^{11}$ to $R^{14}$ each are a phenyl group or a substituted phenyl group, for example, phenyl group or tolyl group. The remaining one group is a $C_{1-18}$ alkyl group, an aryl group, or a silane compound bonded by a Si—C bond to the silicon atom. Examples of the anion (Y) include a halogen ion such as chlorine ion ($Cl^-$), bromine ion ($Br^-$), and iodine ion ($I^-$), and an acid group such as carboxylate (—$COO^-$), sulfonate (—$SO_3^-$), and alcoholate (—$O^-$). This compound can be purchased as a commercial product. Examples thereof include tetraalkyl phosphonium halides such as tetra-n-butyl phosphonium halides and tetra-n-propyl phosphonium halides, trialkylbenzyl phosphonium halides such as triethylbenzyl phosphonium halides, triphenyl monoalkyl phosphonium halides such as triphenylmethyl phosphonium halides and triphenylethyl phosphonium halides, triphenylbenzyl phosphonium halides, tetraphenyl phosphonium halides, tritolyl monoaryl phosphonium halides, and tritolyl monoalkyl phosphonium halides (the halogen atom is a chlorine atom or a bromine atom). The especially preferred among them are triphenyl monoalkyl phosphonium halides such as triphenylmethyl phosphonium halides and triphenylethyl phosphonium halides, triphenyl monoaryl phosphonium halides such as triphenylbenzyl phosphonium halides, tritolyl monoaryl phosphonium halides such as tritolyl monophenyl phosphonium halides, and tritolyl monoalkyl phosphonium halides such as tritolyl monomethyl phosphonium halides (the halogen atom is a chlorine atom or a bromine atom).

Examples of the phosphines include primary phosphines such as methyl phosphine, ethyl phosphine, propyl phosphine, isopropyl phosphine, isobutyl phosphine, and phenyl phosphine, secondary phosphines such as dimethyl phosphine, diethyl phosphine, diisopropyl phosphine, diisoamyl phosphine, and diphenyl phosphine, and tertiary phosphines such as trimethyl phosphine, triethyl phosphine, triphenyl phosphine, methyldiphenyl phosphine, and dimethylphenyl phosphine.

The compound of Formula (D-8) above is a tertiary sulfonium salt having a structure of $R^{15}R^{16}R^{17}S^+Y^-$. $R^{15}$, $R^{16}$, and $R^{17}$ are each a $C_{1-18}$ alkyl group or aryl group, or a silane compound bonded by a Si—C bond to the silicon atom. It is preferred that three of the four substitution groups of $R^{15}$ to $R^{17}$ each are a phenyl group or a substituted phenyl group, for example, phenyl group or tolyl group. The remaining one group is a $C_{1-18}$ alkyl group or an aryl group. Examples of the anion ($Y^-$) include a halogen ion such as chlorine ion ($Cl^-$), bromine ion ($Br^-$), and iodine ion ($I^-$), and an acid group such as carboxylate (—$COO^-$), sulfonate (—$SO_3^-$), and alcoholate (—$O^-$). This compound can be purchased as a commercial product. Examples thereof include tetraalkyl phosphonium halides such as tri-n-butyl sulfonium halides and tri-n-propyl sulfonium halides, trialkylbenzyl sulfonium halides such as diethylbenzyl sulfonium halides, diphenyl monoalkyl sulfonium halides such as diphenylmethyl sulfonium halides and diphenylethyl sulfonium halides, triphenyl sulfonium halides, (the halogen atom is a chlorine atom or a bromine atom), tetraalkyl phosphonium carboxylates such as tri-n-butyl sulfonium carboxylates and tri-n-propyl sulfonium carboxylates, trialkylbenzyl sulfonium carboxylates such as diethylbenzyl sulfonium carboxylates, diphenyl monoalkyl sulfonium carboxylates such as diphenyl methyl sulfonium carboxylates and diphenyl ethyl sulfonium carboxylates, triphenyl sulfonium carboxylates, and halides thereof. Triphenyl sulfonium halides and triphenyl sulfonium carboxylates are especially preferred.

The curing catalyst is contained at 0.01 parts by mass to 10 parts by mass, or 0.01 parts by mass to 5 parts by mass, or 0.01 parts by mass to 3 parts by mass per 100 parts by mass of the polyorganosiloxane.

The hydrolyzable organosilane can be hydrolyzed using the catalyst in a solvent and condensed, and the obtained hydrolytic condensate (polymer) can be distilled under reduced pressure to remove an alcohol, which is a byproduct, and the used hydrolysis catalyst and water at the same time. Further, the acid or base catalyst used for the hydrolysis can be removed by neutralization or ion exchange. In the composition for forming a lithographic resist underlayer film according to the present invention, the composition for forming a resist underlayer film that includes the hydrolytic condensate can additionally include an organic acid, water, an alcohol, or a combination thereof for stabilization.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among them, oxalic acid and maleic acid are preferred. The organic acid is added in an amount of 0.5 parts by mass to 5.0 parts by mass per 100 parts by mass of the condensate (polyorganosiloxane). Pure water, ultrapure water, or ion-exchange water can be added as the aforementioned water. The amount of water added can be 1 part by mass to 20 parts by mass per 100 parts by mass of the composition for forming a resist underlayer film.

The alcohol to be added is preferably such that is easily evaporated by heating after coating. Examples of suitable alcohol include methanol, ethanol, propanol, isopropanol, and butanol. The amount of alcohol added can be 1 part by mass to 20 parts by mass per 100 parts by mass of the composition for forming a resist underlayer film.

In addition to the above-described components, the composition for forming a lithographic resist underlayer film according to the present invention can include, as necessary, an organic polymer compound, a photo-acid generator, and a surfactant.

By using an organic polymer compound, it is possible to adjust the dry etching rate (reduction amount in film thickness per unit time), attenuation factor, and refractive index of the resist underlayer film formed from the composition for forming a lithographic underlayer film according to the present invention.

The organic polymer compound is not particularly limited, and organic polymers of various kinds can be used. A polycondensation polymer and an addition polymerization polymer can be used. An addition polymerization polymer and a polycondensation polymer, such as polyesters, polystyrene, polyimides, acrylic polymers, methacrylic polymers, polyvinyl ether, phenol novolac, naphthol novolac, polyethers, polyamides, and polycarbonates can be used. An organic polymer which has an aromatic ring structure such as a benzene ring, a naphthalene ring, an anthracene ring, a triazine ring, a quinoline ring, and a quinoxaline ring functioning as a light-absorbing moiety is preferably used.

Examples of such an organic polymer compound include addition polymerization polymers including as a structural unit an addition-polymerizable monomer such as benzyl acrylate, benzyl methacrylate, phenyl acrylate, naphthyl acrylate, anthryl methacrylate, anthryl methyl methacrylate, styrene, hydroxystyrene, benzyl vinyl ether, and N-phenyl maleimide, and polycondensation polymers such as phenol novolac and naphthol novolac.

When an addition polymerization polymer is used as the organic polymer compound, this polymer compound may be a homopolymer or a copolymer. An addition-polymerizable monomer is used to produce the addition polymerization polymer. Examples of such an addition-polymerizable monomer include acrylic acid, methacrylic acid, acrylic acid ester compounds, methacrylic acid ester compounds, acrylamide compounds, methacrylamide compounds, vinyl compounds, styrene compound, maleimide compounds, maleic anhydride, and acrylonitrile.

Examples of the acrylic acid ester compounds include methyl acrylate, ethyl acrylate, n-hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 5-acryloyloxy-6-hydroxynorbornene-2-carboxylic-6-lactone, 3-acryloxypropyltriethoxysilane, and glycidyl acrylate.

Examples of the methacrylic acid ester compounds include methyl methacrylate, ethyl methacrylate, n-hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-bemzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethaerylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinyl naphthalene, and vinyl anthracene.

Examples of the styrene compound include styrene, hydroxystyrene, chlorostyrene, bromostyrene, methoxystyrene, cyanostyrene, and acetyl styrene.

Examples of the maleimide compound include maleimide, N-methyl maleimide, N-phenyl maleimide, N-cyclohexyl maleimide, N-benzyl maleimide, and N-hydroxyethyl maleimide.

When a polycondensation polymer is used as a polymer, examples of such a polymer include polymers obtained by polycondensation of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Other examples include polyesters, polyamides, and polyimides such as polypyromellitimide, poly(p-phenylene terephthalamide), polybutylene terephthalate, and polyethylene terephthalate.

When a hydroxyl group is contained in the organic polymer compound, this hydroxyl group can participate in a crosslinking reaction with the polyorganosiloxane.

A polymer compound with a weight-average molecular weight of, for example, 1000 to 1,000,000, or 3000 to 300,000, or 5000 to 200,000, or 10,000 to 100,000 can be used as the organic polymer compound.

Only one organic polymer or a combination of two or more thereof can be used.

When the organic polymer compound is used, the ratio thereof is 1 part by mass to 200 parts by mass, 5 parts by mass to 100 parts by mass, or 10 parts by mass to 50 parts by mass, or 20 parts by mass to 30 parts by mass per 100 parts by mass of the condensate (polyorganosiloxane).

The composition for forming a resist underlayer film according to the present invention can include an acid generator.

Examples of the acid generator include a thermo-acid generator and a photo-acid generator.

The photo-acid generator generates an acid when the resist is exposed. Therefore, the degree of acidity of the underlayer film can be adjusted. This is one of the methods for matching the degree of acidity of the underlayer film with the degree of acidity of the resist of the upper layer. By adjusting the degree of acidity of the underlayer film, it is also possible to adjust the pattern shape of the resist formed in the upper layer.

Examples of the photo-acid generator contained in the composition for forming a resist underlayer film according to the present invention include onium chloride compounds, sulfonimide compounds, and disulfonyl diazomethane compounds.

Examples of the onium chloride compounds include iodonium salt compounds such as diphenyliodonium hexafluorophosphate, diphenyliodonium trifluoromethane sulfonate, diphenyliodonium nonafluoro-n-butane sulfonate, diphenyliodonium perfluoro-n-octane sulfonate, diphenyliodonium camphor sulfonate, bis(4-tert-butylphenyl)iodonium camphor sulfonate, and bis(4-tert-butylphenyl)iodonium trifluoromethane sulfonate, and sulfonium salt compounds such as triphenylsulfonium hexafluoroantimonate, triphenylsulfonium nonafluoro-n-butane sulfonate, triphenylsulfonium camphor sulfonate, and triphenylsulfonium trifluoromethane sulfonate.

Examples of the sulfonimide compound include N-(trifluoromethane sulfonyloxy)succinimide, N-(nonafluoro-n-butane sulfonyloxy)succinimide, N-(camphor sulfonyloxy)succinimide, and N-(trifluoromethane sulfonyloxy)naphthalimide.

Examples of the disulfonyl diazomethane compounds include bis(trifluoromethyl sulfonyl)diazomethane, bis(cyclohexyl sulfonyl)diazomethane, bis(phenylsulfonyl)diazomethane, bis(p-toluenesulfonyl)diazomethane, bis(2,4- dimethylbenzene sulfonyl)diazomethane, and methylsulfonyl-p-toluene sulfonyl diazomethane.

Only one photo-acid generator can be used or a combination of two or more thereof can be used.

When the photo-acid generator is used, the ratio thereof is 0.01 parts by mass to 5 parts by mass, or 0.1 parts by mass to 3 parts by mass, or 0.5 parts by mass to 1 part by mass per 100 parts by mass of the condensate (polyorganosiloxane).

A surfactant is effective in inhibiting the generation of pinholes and striation when the composition for forming a lithographic resist underlayer film according to the present invention is coated on a substrate.

Examples of the surfactant that can be contained in the composition for forming a resist underlayer film according to the present invention include nonionic surfactants such as polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorinated surfactants such as EFTOP EF301, EF303, EF352 (trade names, manufactured by Tochem Products Co., Ltd.), MEGAFAC F171, F173, R-08, R-30 (trade names, manufactured by Dainippon Ink and Chemicals Inc.), Fluorad FC430, FC431 (manufactured by Sumitomo 3M Ltd.), and Asahi Guard AG710, Surflon S-382, SC101, SC102, SC103, SC104, SC105, SC106 (trade names, manufactured by Asahi Glass Co., Ltd.), and organosiloxane polymer KP341 (Shinetsu Chemical Co., Ltd.). These surfactants may be used individually or in combinations of two or more thereof. When the surfactant is used, the ratio thereof is 0.0001 parts by mass to 5 parts by mass, or 0.001 parts by mass to 1 part by mass, or 0.01 parts by mass to 0.5 parts by mass per 100 parts by mass of the condensate (polyorganosiloxane).

A rheology-adjusting agent and an adhesion enhancer can be added to the composition for forming a resist underlayer film according to the present invention. The rheology-adjusting agent is effective in improving the flowability of the composition for forming an underlayer film. The adhesion enhancer is effective in improving the adhesion of the underlayer film to the semiconductor substrate or resist.

Any solvent can be used without a particular limitation in the composition for forming a resist underlayer film according to the present invention, provided that the solvent is capable of dissolving the aforementioned solid components. Examples of suitable solvents include methyl cellosolve acetate, ethyl cellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methyl propionate, ethyl ethoxyacetate, ethyl hydroxyacetate, methyl 2-hydroxy-3-methyl butanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methyl propionate, methyl 3-methoxy-2-methyl propionate, methyl 2-hydroxy-3-methyl butyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethyl formamide, N-methylacetamide, N,N-dimethylacetamide, N-methylpyrrolidone, and γ-butyrolactone. Those solvents can be used individually or in combinations of two or more thereof.

The usage of the composition for forming a resist underlayer film according to the present invention will be explained below.

The composition for forming a resist underlayer film according to the present invention is coated by an appropriate coating method, for example, with a spinner or a coater, on a substrate used for producing semiconductor device (for example, a silicon wafer substrate, a silicon/silicon-dioxide-coated substrate, a silicon nitride substrate, a glass substrate, an ITO substrate, a polyimide substrate and a substrate coated with a material with a low dielectric constant (low-k material)) and then baked to form a resist underlayer film. The baking conditions can be selected, as appropriate, from a baking temperature of 80° C. to 250° C. and a baking time of 0.3 minutes to 60 minutes. Preferably, the baking temperature is 150° C. to 250° C. and the baking time is 0.5 minutes to 2 minutes. The thickness of the underlayer film formed herein is, for example, 10 nm to 1000 nm, or 20 nm to 500 nm, or 50 nm to 300 nm, or 100 nm to 200 nm.

Then, a layer, for example of a photoresist, is formed on the resist underlayer film. The photoresist layer can be formed by the conventional method, that is, by coating a photoresist composition solution on the underlayer film and baking. The thickness of the photoresist is, for example, 50 nm to 10,000 nm, or 100 nm to 2000 nm, or 200 nm to 1000 nm.

According to the present invention, after the organic underlayer film has been formed on the substrate, the resist underlayer film according to the present invention can be formed thereupon and then a photoresist can be further coated on the resist underlayer film. As a result, the substrate can be processed by selecting an appropriate etching gas even when the photoresist pattern width is small and the photoresist is coated thinly in order to prevent the pattern from collapsing. For example, the resist underlayer film according to the present invention can be processed by using as an etching gas a fluorine-containing gas that ensures a sufficiently high etching rate of the photoresist. Further, the organic underlayer film can be processed by using as an etching gas an oxygen-containing gas that ensures a sufficiently high etching rate of the resist underlayer film according to the present invention. In addition, the substrate can be processed by using as an etching gas a fluorine-containing gas that ensures a sufficiently high etching rate of the organic underlayer film.

The photoresist to be formed on the resist underlayer film according to the present invention is not particularly limited, provided that the photoresist is sensitive to the exposure light, and any of negative-type and positive-type photoresists can be used. Examples of such photoresists include a positive-type photoresist consisting of a novolak resin and 1,2-naphthoquinone diazide sulfonic acid ester, a chemically-amplified photoresist consisting of a photo-acid generator and a binder having a group which is decomposed by an acid and increases the alkali dissolution rate, a chemically-amplified photoresist consisting of an alkali-soluble binder, a photo-acid generator, and a low-molecular compound which is decomposed by an acid and increases the alkali dissolution rate of the photoresist, a chemically-amplified photoresist consisting of a photo-acid generator, a binder having a group which is decomposed by an acid and increases the alkali dissolution rate, and a low-molecular compound which is decomposed by an acid and increases the alkali dissolution rate of the photoresist. Specific examples include: APEX-E (trade name, manufactured by Shipley Co.), PAR710 (trade name, manufactured by Sumitomo Chemical Co., Ltd.), and SEPR430 (trade name, manufactured by Shinetsu Chemical Co., Ltd.). Further, for example, fluorine-containing polymer photoresists such as described in Proc. SPIE, Vol. 3999, 330-334 (2000), Proc. SPIE, Vol. 3999, 357-364 (2000), and Proc. SPIE, Vol. 3999, 365-374 (2000) can be used.

Exposure is then carried out through a predetermined mask. A KrF excimer laser (wavelength 248 nm), an ArF excimer laser (wavelength 193 nm) and an F2 excimer laser (wavelength 157 nm) can be used for the exposure. After the exposure, post exposure bake can be performed, if necessary. The post exposure bake can be conducted under the conditions that are selected, as appropriate, from a heating temperature of 70° C. to 150° C. and a heating time of 0.3 minutes to 10 minutes.

According to the present invention, an electron beam lithographic resist can be used instead of the photoresist as the resist. Any of negative-type and positive-type electron beam resists can be used. Examples of the electron beam resists include a chemically-amplified resist consisting of an acid generator and a binder having a group which is decomposed by an acid and changes the alkali dissolution rate, a chemically-amplified resist consisting of an alkali-soluble binder, an acid generator, and a low-molecular compound which is decomposed by an acid and changes the alkali dissolution rate of the resist, a chemically-amplified resist consisting of an acid generator, a binder having a group which is decomposed by an acid and changes the alkali dissolution rate, and a low-molecular compound which is decomposed by an acid and changes the alkali dissolution rate of the resist, a non-chemically-amplified resist consisting of a binder having a group that is decomposed by an electron beam and changes the alkali dissolution rate, and a non-chemically-amplified resist consisting of a binder having a moiety that is cut by an electron beam and changes the alkali dissolution rate. When such electron beam resists are used, the resist pattern can be also formed with an electron beam as an irradiation source in the same manner as when a photoresist is used.

Then, development is performed by using a developer. As a result, for example, where a positive-type photoresist is used, the exposed part of the photoresist is removed and a photoresist pattern is formed.

Examples of the developer include alkaline aqueous solution such as aqueous solutions of alkali metal hydroxide such as potassium hydroxide and sodium hydroxide, aqueous solutions of quaternary ammonium hydroxide such as tetramethylammonium hydroxide, tetraethylammonium hydroxide, and choline, amine aqueous solutions such as ethanolamine, propylamine, and ethylenediamine. Further, surfactants can be added to those developers. The conditions of development are selected, as appropriate, from a temperature of 5° C. to 50° C. and a time of 10 sec to 600 sec.

The resist underlayer film (interlayer) according to the present invention is then removed by using the pattern of the photoresist (upper layer) formed in the above-described manner as a protective film, and the organic underlayer film (lower layer) is thereafter removed by using the patterned photoresist and the resist underlayer film (intermediate layer) according to the present invention as protective films. The semiconductor substrate is processed by using the patterned resist underlayer film (interlayer) according to the present invention and the organic underlayer film (lower layer) as protective films.

First, the resist underlayer film (interlayer) according to the present invention of the portion from which the photoresist has been removed is removed by dry etching and the semiconductor substrate is exposed. The dry etching of the resist underlayer film according to the present invention can be performed by using a gas such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane. It is preferred that a halogen-containing gas is used for dry etching the resist underlayer film. With dry etching by a halogen-containing gas, the photoresist constituted by an organic compound is basically difficult to be removed. By contrast, the resist underlayer film according to the present invention that contains a large number of silicon atoms can be removed rapidly by the halogen-containing gas. Therefore, the reduction in thickness of the photoresist in the dry etching of the resist underlayer film can be inhibited. As a result, a photoresist can be used in the form of a thin film. It is preferred that the resist underlayer film is dry etched with a fluorine-containing gas. Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

The organic underlayer film is then removed by using the film constituted by the patterned photoresist and the resist underlayer film according to the present invention as a protective film. The organic underlayer film (lower layer) is dry etched preferably with an oxygen-containing gas. This is because the resist underlayer film according to the present invention that includes a large number of silicon atoms is difficult to remove by dry etching with an oxygen-containing gas.

Finally, the semiconductor substrate is processed. The processing of the semiconductor substrate is preferably performed by dry etching using a fluorine-containing gas.

Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

Before forming the photoresist, an organic anti-reflective film can be formed on the upper layer of the resist underlayer film according to the present invention. The anti-reflective film composition used in such a case is not particularly limited, and can be arbitrarily selected from those compositions that have been conventionally used in the lithographic process. The anti-reflective film can be formed by coating by the conventional method, for example, with a spinner or a coater, and baking.

The substrate onto which the composition for forming a resist underlayer film according to the present invention is coated may have an organic or inorganic anti-reflective film on the surface formed by a CVD method or the like, and the underlayer film according to the present invention can be formed thereon.

Depending on the wavelength of light used in the lithographic process, the resist underlayer film formed with the composition for forming a resist underlayer film according to the present invention can absorb this light. In such a case, the resist underlayer film can function as an anti-reflective film having a preventing effect against the light reflected from the substrate. Further, the underlayer film according to the present invention can be also used as a layer for preventing the interaction between the substrate and the photoresist, a layer having a function of preventing the adverse effect produced on the substrate by the material used for the photoresist or the substance generated when the photoresist is exposed, a layer having a function of preventing the diffusion of the substance generated from the substrate during heating and baking into the upper layer photoresist, and a barrier layer for reducing the poisoning effect of the dielectric layer of the semiconductor substrate on the photoresist layer.

Further, the resist underlayer film formed from the composition for forming a resist underlayer film can be used as a filling agent that can be applied to a substrate with via holes formed to be used in a dual damascene process and can fill the holes, without gaps. In addition, the resist underlayer film can be used as a flattening material for flattening the surface of a semiconductor substrate having protrusions and depressions thereon.

The present invention will be described below based on specific examples thereof, but the present invention is not limited thereto.

EXAMPLES

The compounds obtained were identified by $^1$H-NMR measurements.

Sample tube: 5 mm, solvent: deuterated chloroform, measurement temperature: room temperature, pulse spacing: 5 sec, number of integration cycles: 32 cycles, reference sample: tetramethylsilane (TMS).

Synthesis of Compound 1

7.70 g of allyl bromide, 19.0 g (3 equivalents relative to the allyl bromide) of acetylacetone, 17.4 g (2 equivalents relative to the allyl bromide) of potassium carbonate, and 61 g of acetone were placed in a 200 ml four-neck flask equipped with a magnetic stirrer and stirred for 9 hours under reflux at 60° C. After cooling to room temperature, the acetone was distilled off under reduced pressure, followed by dilution with 60 g of ethyl acetate. 1N Hydrochloric acid was added to obtain pH 3, and the organic phase was washed twice with 50 g of pure water. The organic phase was concentrated and dried and 7.3 g of Intermediate 1 was obtained (yield 82%).

1H-NMR (400 MHz): keto form; 2.20 ppm (s, 6H), 2.61 ppm (m, 2H), 3.73 ppm (t, 1H), 5.05 ppm to 5.12 ppm (m, 2H), 5.68 ppm to 5.77 ppm (m, 1H), enol form; 2.11 ppm (s, 6H), 2.99 ppm (m, 2H), 5.05 ppm to 5.12 ppm (m, 2H), 5.79 ppm to 5.96 ppm (m, 1H). The keto:enol molar ratio was 71:29.

6.93 g of Intermediate 1, 490 µl of Karstedt's catalyst (0.1 Mil xylene solution of platinum (0)-1,3-divinyl-1,1,3,3-tetramethyldisiloxane complex), and 42 g of toluene were placed in a 100 ml four-neck flask equipped with a magnetic stirrer, and 10.8 ml (1.2 equivalent relative to the reaction Intermediate 1) of triethoxysilane was dropwise added over 10 minutes. A crude product obtained after stirring for 1 day at room temperature was purified by distillation under reduced pressure, and 10.23 g of Compound 1, which is a target product, was obtained (yield 68%).

1H-NMR (400 MHz): keto form; 0.64 ppm (t, 2H), 1.23 ppm (t, 9H), 1.37 ppm (quint, 2H), 1.89 ppm (q, 2H), 2.19 ppm (s, 6H), 3.63 ppm (t, 1H), 3.81 ppm (q, 6H), enol form; 0.68 ppm (t, 2H), 1.25 ppm (t, 9H), 1.52 ppm (quint, 2H), 2.14 ppm (s, 6H), 2.26 ppm (t, 2H), 3.80 ppm (q, 6H). The keto:enol molar ratio was 72:28. The calculated pKa of Compound 1 was 10.57.

The reaction scheme of Compound 1 is shown below.

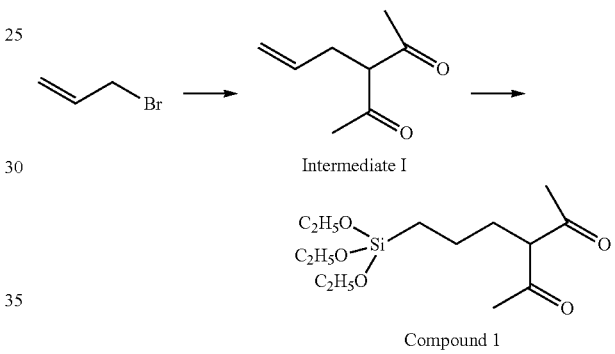

Intermediate I

Compound 1

Synthesis of Compound 2

9.38 g of potassium carbonate (0.5 equivalent relative to ethyl(trifluoroacetyl)acetate) and 30 g of acetone were placed in a 200 ml four-neck flask equipped with a magnetic stirrer and stirred at room temperature. Then, a solution of which 8.21 g of allyl bromide (0.5 equivalent relative to ethyl(trifluoroacetyl)acetate) and 25.00 g of ethyl(trifluoroacetyl)acetate) are dissolved in 20 g of acetone was dropwise added, followed by stirring for 4 hours under reflux at 60° C. After cooling to room temperature, the reaction liquid was diluted with 200 g of ethyl acetate and 50 g of pure water, and 1N hydrochloric acid was added to obtain pH 3. The aqueous phase was removed, and the organic phase was washed once with 50 g of saturated saline. The organic phase was concentrated and dried, the obtained crude product was purified by distillation under reduced pressure, and 10.0 g of Intermediate 2 was obtained (yield 66%).

1H-NMR (400 MHz) keto form; 1.27 ppm (t, 3H), 2.71 ppm (t, 2H), 3.94 ppm (t, 1H), 4.20 ppm (q, 2H), 5.06 ppm to 5.17 ppm (m, 2H), 5.68 ppm to 5.80 ppm (m, 1H), enol form; 1.32 ppm (t, 3H), 3.00 ppm (dd, 2H), 4.27 ppm (q, 2H), 5.06 ppm to 5.17 ppm (m, 2H), 5.68 ppm to 5.80 ppm (m, 1H), keto:enol molar ratio was 58:42.

Then, 10.00 g of Intermediate 2, 1120 µl of Karstedt's catalyst (0.25 M/l xylene solution of platinum (0)-1,3-divinyl-1,1,3,3-tetramethyldisiloxane complex), and 60 g of toluene were placed in a 200 ml four-neck flask equipped with a magnetic stirrer, and 9.8 ml (1.2 equivalent relative to the reaction Intermediate 2) of triethoxysilane was dropwise added over 10 minutes. After stirring for 4 hours at room temperature, the reaction liquid was concentrated and dried, the obtained crude product was twice purified by distillation under reduced pressure, and 4.33 g of Compound 2 was obtained (yield 25%).

1H-NMR (400 MHz) in CDCl$_3$: keto form; 0.65 ppm (t, 2H), 1.27 ppm (t, 9H), 1.35 ppm (t, 2H), 1.40 ppm to 1.54 ppm (m, 2H), 2.33 ppm (t, 1H), 3.82 ppm (q, 6H), 4.31 ppm (q, 2H), enol form; 0.65 ppm (t, 2H), 1.22 ppm (t, 9H), 1.45 ppm (q, 2H), 2.00 ppm (q, 2H), 3.80 ppm (q, 6H), 4.21 ppm (q, 2H), keto:enol molar ratio was 20:80.

The calculated pKa of Compound 2 was 8.84.

The reaction scheme of Compound 2 is shown below.

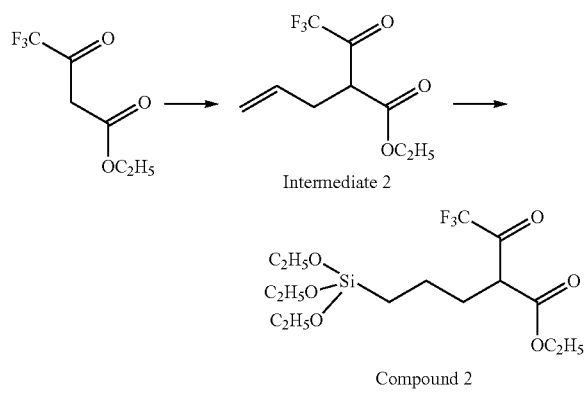

Compound 2

Synthesis of Compound 3

15.00 g of diethyl allyl malonate, 1870 µl of Karstedt's catalyst (0.25 M/l xylene solution of platinum (±)-1,3-divinyl-1,1,3,3-tetramethyldisiloxane complex), and 90 g of toluene were placed in a 200 ml four-neck flask equipped with a magnetic stirrer, and 13.7 ml (1.1 equivalent relative to the diethyl allyl malonate) of triethoxysilane was dropwise added over 10 minutes. After stirring for 5 hours at room temperature, the reaction liquid was concentrated and dried, the obtained crude product was purified by distillation under reduced pressure, and 16.68 g of Compound 3 was obtained (yield 61%).

1H-NMR (400 MHz) in CDCl$_3$: keto form; 0.66 ppm (t, 2H), 1.22 ppm (t, 9H), 1.27 ppm (t, 6H), 1.42 ppm to 1.50 ppm (m, 2H), 1.93 ppm (q, 2H), 3.34 ppm (t, 1H), 3.81 ppm (q, 6H), 4.20 ppm (q, 4H), keto:enol molar ratio was 100:0.

The calculated pKa of Compound 3 was 12.97.

The reaction scheme of Compound 3 is shown below.

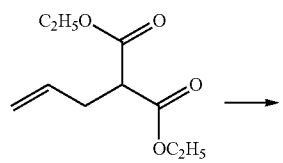

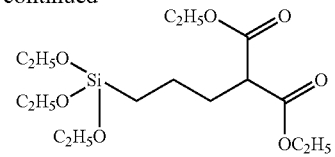

Compound 3

Synthesis of Compound 4

19.2 g of di-tert-butyl allyl malonate, 1870 µl of Karstedt's catalyst (0.25 M/l xylene solution of platinum (0)-1,3-divinyl-1,1,3,3-tetramethyldisiloxane complex), and 90 g of toluene were placed in a 200 ml four-neck flask equipped with a magnetic stirrer, and 13.7 ml (1.1 equivalent relative to the di-tert-butyl allyl malonate) of triethoxysilane was dropwise added over 10 minutes. After stirring for 5 hours at room temperature, the reaction liquid was concentrated and dried, the obtained crude product was purified by distillation under reduced pressure, and 17.01 g of Compound 4 was obtained (yield 54%).

1H-NMR (400 MHz) in CDCl$_3$: keto form; 0.66 ppm (t, 2H), 1.42 ppm to 1.50 ppm (m, 20H), 1.93 ppm (q, 2H), 3.33 ppm (t, 1H), 3.82 ppm (q, 6H), 4.21 ppm (q, 4H), keto:enol molar ratio was 100:0.

The calculated pKa of Compound 4 was 12.90. The pKa of a derivative obtained by hydrolyzing Compound 4 in a 0.01 M/l aqueous solution of dilute hydrochloric acid and converting into a dicarboxylic acid was 5.78.

The reaction scheme of Compound 4 is shown below.

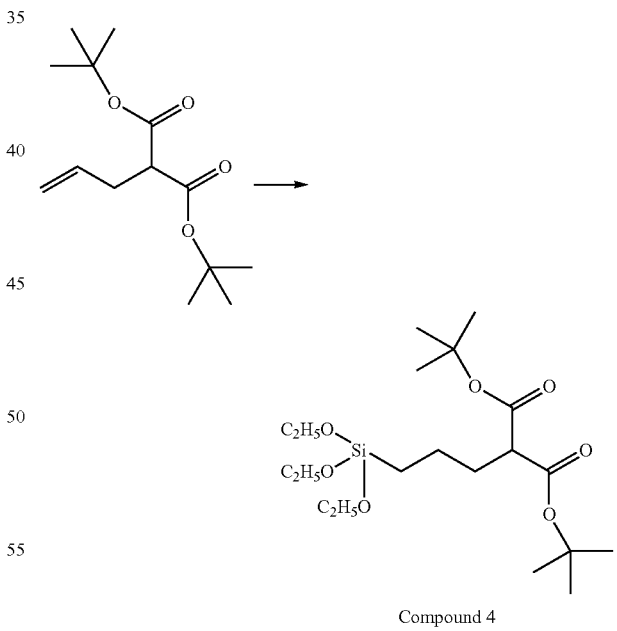

Compound 4

Synthesis Example 1

1.52 g (5 mol % in the entire silane) of Compound (1), 14.58 g (70 mol % in the entire silane) of tetraethoxysilane, 0.99 g (5 mol % in the entire silane) of phenyltrimethoxysilane, 3.57 g (20 mol % in the entire silane) of methyltriethoxysilane, and 30.99 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 21.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (5-1)). The weight-average molecular weight of the obtained polymer which was determined by GPC was Mw 1600 (calculated as polystyrene).

Synthesis Example 2

1.94 g (5 mol % in the entire silane) of Compound (2), 14.58 g (70 mol % in the entire silane) of tetraethoxysilane, 0.99 g (5 mol % in the entire silane) of phenyltrimethoxysilane, 3.57 g (20 mol % in the entire silane) of methyltriethoxysilane, and 31.62 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 21.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (5-2)). The weight-average molecular weight of the obtained polymer which was determined by GPC was Mw 1500 (calculated as polystyrene).

Synthesis Example 3

1.94 g (5 mol % in the entire silane) of Compound (3), 14.58 g (70 mol % in the entire silane) of tetraethoxysilane, 0.99 g (5 mol % in the entire silane) of phenyltrimethoxysilane, 3.57 g (20 mol % in the entire silane) of methyltriethoxysilane, and 31.62 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 21.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (5-3)). The weight-average molecular weight of the obtained polymer which was determined by GPC was Mw 1600 (calculated as polystyrene).

Synthesis Example 4

1.52 g (5 mol % in the entire silane) of Compound (1), 14.58 g (70 mol % in the entire silane) of tetraethoxysilane, 0.99 g (5 mol % in the entire silane) of phenyltrimethoxysilane, 3.30 g (18.5 mol % in the entire silane) of methyltriethoxysilane, 0.36 g (1.5 mol % in the entire silane) of (4-methoxybenzyl)trimethoxysilane, and 31.14 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 21.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (5-4)). The weight-average molecular weight of the obtained polymer which was determined by GPC was Mw 1500 (calculated as polystyrene).

Synthesis Example 5

1.52 g (5 mol % in the entire silane) of Compound (1), 14.58 g (70 mol % in the entire silane) of tetraethoxysilane, 0.99 g (5 mol % in the entire silane) of phenyltrimethoxysilane, 3.30 g (18.5 mol % in the entire silane) of methyltriethoxysilane, 0.36 g (1.5 mol % in the entire silane) of (4-ethoxyphenyl)trimethoxysilane, and 31.14 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 21.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (5-5)). The weight-average molecular weight of the obtained polymer which was determined by GPC was Mw 1500 (calculated as polystyrene).

Synthesis Example 6

1.52 g (5 mol % in the entire silane) of Compound (1), 14.58 g (70 mol % in the entire silane) of tetraethoxysilane, 0.99 g (5 mol % in the entire silane) of phenyltrimethoxysilane, 3.30 g (18.5 mol % in the entire silane) of methyltriethoxysilane, 0.43 g (1.5 mol % in the entire silane) of (4-ethoxyethoxyphenyl)trimethoxysilane, and 31.24 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 21.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (5-6)). The weight-average molecular weight of the obtained polymer which was determined by GPC was Mw 1600 (calculated as polystyrene).

Synthesis Example 7

1.52 g (5 mol % in the entire silane) of Compound (1), 14.58 g (70 mol % in the entire silane) of tetraethoxysilane, 0.99 g (5 mol % in the entire silane) of phenyltrimethoxysilane, 3.30 g (18.5 mol % in the entire silane) of methyltriethoxysilane, 0.51 g (1.5 mol % in the entire silane) of (4-ethoxyethoxybenzyl)triethoxysilane, and 31.36 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 21.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (5-7)). The weight-average molecular weight of the obtained polymer which was determined by GPC was Mw 1600 (calculated as polystyrene).

Synthesis Example 8

1.52 g (5 mol % in the entire silane) of Compound (1), 14.58 g (70 mol % in the entire silane) of tetraethoxysilane, 2.07 g (5 mol % in the entire silane) of 3-(triethoxysilylpropyl)diallylisocyanurate, 3.56 g (20 mol % in the entire silane) of methyltriethoxysilane, and 32.61 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 22.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (5-8)). The weight-average molecular weight of the obtained polymer which was determined by GPC was Mw 1600 (calculated as polystyrene).

Synthesis Example 9

1.52 g (5 mol % in the entire silane) of Compound (1), 14.58 g (70 mol % in the entire silane) of tetraethoxysilane, 2.07 g (5 mol % in the entire silane) of 3-(triethoxysilylpropyl)diallylisocyanurate, 3.30 g (18.5 mol % in the entire silane) of methyltriethoxysilane, 0.36 g (1.5 mol % in the entire silane) of (4-methoxybenzyl)trimethoxysilane, and 32.75 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 22.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (5-9)). The weight-average molecular weight of the obtained polymer which was determined by GPC was Mw 1600 (calculated as polystyrene).

Synthesis Example 10

1.52 g (5 mol % in the entire silane) of Compound (1), 14.58 g (70 mol % in the entire silane) of tetraethoxysilane, 2.07 g (5 mol % in the entire silane) of 3-(triethoxysilylpropyl)diallylisocyanurate, 3.30 g (18.5 mol % in the entire silane) of methyltriethoxysilane, 0.36 g (1.5 mol % in the entire silane) of (4-ethoxyphenyl)trimethoxysilane, and 32.75 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 22.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (5-10)). The weight-average molecular weight of the obtained polymer which was determined by GPC was Mw 1600 (calculated as polystyrene).

Synthesis Example 11

1.52 g (5 mol % in the entire silane) of Compound (1), 14.58 g (70 mol % in the entire silane) of tetraethoxysilane, 2.07 g (5 mol % in the entire silane) of 3-(triethoxysilylpropyl)diallylisocyanurate, 3.30 g (18.5 mol % in the entire silane) of methyltriethoxysilane, 0.43 g (1.5 mol % in the entire silane) of (4-ethoxyethoxyphenyl)trimethoxysilane, and 32.85 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 22.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (5-11)). The weight-average molecular weight of the obtained polymer which was determined by GPC was Mw 1600 (calculated as polystyrene).

Synthesis Example 12

1.52 g (5 mol % in the entire silane) of Compound (1), 14.58 g (70 mol % in the entire silane) of tetraethoxysilane, 2.07 g (5 mol % in the entire silane) of 3-(triethoxysilylpropyl)diallylisocyanurate, 3.30 g (18.5 mol % in the entire silane) of methyltriethoxysilane, 0.51 g (1.5 mol % in the entire silane) of (4-ethoxyethoxybenzyl)trimethoxysilane, and 32.98 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 22.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (5-12)). The weight-average molecular weight of the obtained polymer which was determined by GPC was Mw 1500 (calculated as polystyrene).

Comparative Synthesis Example 1

14.58 g (70 mol % in the entire silane) of tetraethoxysilane, 0.99 g (5 mol % in the entire silane) of phenyltrimethoxysilane, 4.46 g (25 mol % in the entire silane) of methyltriethoxysilane, and 30.05 g of acetone were placed in a 100 mL flask, and a solution was formed. The obtained mixed solution was heated with stirring with a magnetic stirrer and refluxed. Then, 6.68 g of a 0.01 M aqueous solution of hydrochloric acid was added to the mixed solution. After the reaction has been conducted for 240 minutes, the obtained reaction solution was cooled to room temperature. Then, 20.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (6-1)). The weight-average molecular weight of the obtained polymer which was determined by GPC was Mw 1600 (calculated as polystyrene).

Formula (6-1)

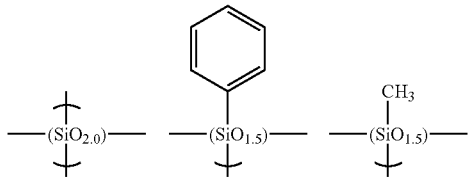

Comparative Synthesis Example 2

2.10 g (5 mol % in the entire silane) of Compound (4), 14.58 g (70 mol % in the entire silane) of tetraethoxysilane, 0.99 g (5 mol % in the entire silane) of phenyltrimethoxysilane, 3.57 g (20 mol % in the entire silane) of methyltriethoxysilane, and 31.86 g of acetone were placed in a 100 mL flask, and a solution was formed. The obtained mixed solution was heated with stirring with a magnetic stirrer and refluxed. Then, 6.67 g of a 0.01 M aqueous solution of hydrochloric acid was added to the mixed solution. After the reaction has been conducted for 240 minutes, the obtained reaction solution was cooled to room temperature. Then, 21.00 g of propylene glycol monomethyl ether acetate was added to the reaction solution, ethanol, which was a reaction byproduct, water, and hydrochloric acid were distilled off under reduced pressure, and a hydrolytic condensate solution was obtained. Then, propylene glycol diethyl ether was added to the hydrolytic condensate solution, and finally a 15% hydrolytic condensate solution was obtained (corresponds to Formula (6-2)). The weight-average molecular weight of the obtained polymer which was determined by GPC was Mw 2100 (calculated as polystyrene).

Formula (6-2)

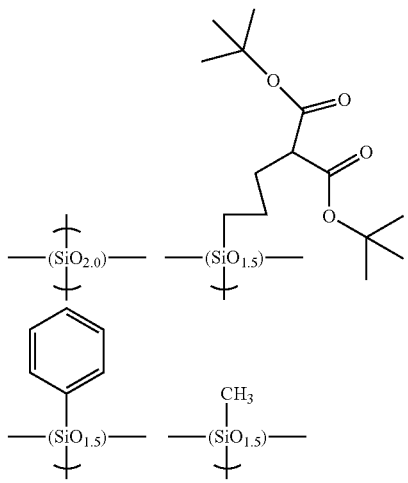

(Preparation of Resist Underlayer Films)

Solutions of compositions for forming resist underlayer films each were prepared by mixing silicon-containing polymers obtained in Synthesis Examples 1 to 12 and Comparative Synthesis Examples 1 and 2, acids, curing catalysts, additive, solvents and water at the ratios shown in Table 1, and filtering with a 0.1 μm fluororesin filter.

In Table 1, the following abbreviations are used: MA—maleic acid; BTEAC—benzyltriethylammonium chloride; IMTEOS—N-(3-triethoxysilylpropyl)-4,5-dihydroimidazole; TPSMA—monotriphenylsulfonium maleate; AcAc—acetylacetone; TfAcEt—ethyl trifluoroacetoacetate; MADE—diethyl malonate; PGMEA—propylene glycol monomethyl ether acetate; PGME—propylene glycol monomethyl ether; and PGEE—propylene glycol monoethyl ether. Ultrapure water was used. Each amount added is expressed in parts by mass. The amount of the polymer added is the mass of the polymer, rather than the mass of the polymer solution.

TABLE 1

|  | Polymer | Acid | Curing catalyst | Additive | Solvent | | | Water |
|---|---|---|---|---|---|---|---|---|
| Example 1 (parts by mass) | Synthesis Example 1 2 | MA 0.06 | BTEAC 0.012 |  | PGMEA 7 | PGME 10 | PGEE 70 | Water 13 |

TABLE 1-continued

| | Polymer | Acid | Curing catalyst | Additive | Solvent | | | Water |
|---|---|---|---|---|---|---|---|---|
| Example 2 (parts by mass) | Synthesis Example 1 2 | MA 0.06 | IMTEOS 0.012 | | PGMEA 7 | PGME 10 | PGEE 70 | Water 13 |
| Example 3 (parts by mass) | Synthesis Example 1 2 | MA 0.06 | TPSMA 0.012 | | PGMEA 7 | PGME 10 | PGEE 70 | Water 13 |
| Example 4 (parts by mass) | Synthesis Example 2 2 | MA 0.06 | BTEAC 0.012 | | PGMEA 7 | PGME 10 | PGEE 70 | Water 13 |
| Example 5 (parts by mass) | Synthesis Example 3 2 | MA 0.06 | BTEAC 0.012 | | PGMEA 7 | PGME 10 | PGEE 70 | Water 13 |
| Example 6 (parts by mass) | Synthesis Example 4 2 | MA 0.06 | BTEAC 0.012 | | PGMEA 7 | PGME 10 | PGEE 70 | Water 13 |
| Example 7 (parts by mass) | Synthesis Example 5 2 | MA 0.06 | BTEAC 0.012 | | PGMEA 7 | PGME 10 | PGEE 70 | Water 13 |
| Example 8 (parts by mass) | Synthesis Example 6 2 | MA 0.06 | BTEAC 0.012 | | PGMEA 7 | PGME 10 | PGEE 70 | Water 13 |
| Example 9 (parts by mass) | Synthesis Example 7 2 | MA 0.06 | BTEAC 0.012 | | PGMEA 7 | PGME 10 | PGEE 70 | Water 13 |
| Example 10 (parts by mass) | Synthesis Example 8 2 | MA 0.06 | BTEAC 0.012 | | PGMEA 7 | PGME 10 | PGEE 70 | Water 13 |
| Example 11 (parts by mass) | Synthesis Example 9 2 | MA 0.06 | BTEAC 0.012 | | PGMEA 7 | PGME 10 | PGEE 70 | Water 13 |
| Example 12 (parts by mass) | Synthesis Example 10 2 | MA 0.06 | BTEAC 0.012 | | PGMEA 7 | PGME 10 | PGEE 70 | Water 13 |
| Example 13 (parts by mass) | Synthesis Example 11 2 | MA 0.06 | BTEAC 0.012 | | PGMEA 7 | PGME 10 | PGEE 70 | Water 13 |
| Example 14 (parts by mass) | Synthesis Example 12 2 | MA 0.06 | BTEAC 0.012 | | PGMEA 7 | PGME 10 | PGEE 70 | Water 13 |
| Comparative Example 1 (parts by mass) | Comparative Synthesis Example 1 2 | MA 0.06 | BTEAC 0.012 | | PGMEA 7 | PGME 10 | PGEE 70 | Water 13 |
| Comparative Example 2 (parts by mass) | Comparative Synthesis Example 1 2 | MA 0.06 | BTEAC 0.012 | AcAc 0.1 | PGMEA 7 | PGME 10 | PGEE 70 | Water 13 |
| Comparative Example 3 (parts by mass) | Comparative Synthesis Example 1 2 | MA 0.06 | BTEAC 0.012 | TfAcEt 0.1 | PGMEA 7 | PGME 10 | PGEE 70 | Water 13 |
| Comparative Example 4 (parts by mass) | Comparative Synthesis Example 1 2 | MA 0.06 | BTEAC 0.012 | MADE 0.1 | PGMEA 7 | PGME 10 | PGEE 70 | Water 13 |
| Comparative Example 5 (parts by mass) | Comparative Synthesis Example 2 2 | MA 0.06 | BTEAC 0.012 | | PGMEA 7 | PGME 10 | PGEE 70 | Water 13 |

(Solvent Resistance Test)

A resist underlayer film was formed by spin coating a composition for forming a resist underlayer film on a silicon wafer and baking on a hot plate for 1 minute at 140° C. The resist underlayer film was then immersed for 1 minute in propylene glycol monomethyl ether acetate that was used as a solvent for the overlayer resist composition. The solvent resistance was considered to be "Good" (denoted by ○ in Table 2) when the difference in the thickness of the resist underlayer film between the states before and after the immersion was equal to or less than 1 nm.

TABLE 2

| Results of solvent resistance test | |
|---|---|
| Example 1 | ○ |
| Example 2 | ○ |
| Example 3 | ○ |
| Example 4 | ○ |
| Example 5 | ○ |
| Example 6 | ○ |
| Example 7 | ○ |
| Example 8 | ○ |
| Example 9 | ○ |
| Example 10 | ○ |
| Example 11 | ○ |
| Example 12 | ○ |
| Example 13 | ○ |
| Example 14 | ○ |

TABLE 2-continued

| Results of solvent resistance test | |
|---|---|
| Comparative Example 1 | ○ |
| Comparative Example 2 | ○ |
| Comparative Example 3 | ○ |
| Comparative Example 4 | ○ |
| Comparative Example 5 | ○ |

(Optical Constant)

The composition for forming a resist underlayer film was coated with a spinner on a silicon wafer. The resist underlayer film (film thickness 0.09 μm) was then formed by heating on a hot plate for 1 minute at 240° C. The optical absorption coefficient (k value, can be also called attenuation coefficient) and refractive index (n value) at a wavelength of 193 nm were then measured for these resist underlayer films with a spectral ellipsometer (VUV-VASE VU-302, manufactured by J. A. Woollam Co., Inc.). The results are shown in Table 3.

TABLE 3

Refractive index n and optical absorption coefficient k

| | Refractive index n (wavelength 193 nm) | Optical absorption coefficient k (wavelength 193 nm) |
|---|---|---|
| Example 1 | 1.65 | 0.13 |
| Example 2 | 1.64 | 0.12 |
| Example 3 | 1.64 | 0.15 |
| Example 4 | 1.63 | 0.12 |
| Example 5 | 1.64 | 0.12 |
| Example 6 | 1.64 | 0.21 |
| Example 7 | 1.65 | 0.20 |
| Example 8 | 1.64 | 0.21 |
| Example 9 | 1.64 | 0.21 |
| Example 10 | 1.70 | 0.10 |
| Example 11 | 1.69 | 0.13 |
| Example 12 | 1.69 | 0.12 |
| Example 13 | 1.69 | 0.13 |
| Example 14 | 1.69 | 0.13 |
| Comparative Example 1 | 1.60 | 0.14 |
| Comparative Example 2 | 1.60 | 0.14 |
| Comparative Example 3 | 1.60 | 0.14 |
| Comparative Example 4 | 1.60 | 0.14 |
| Comparative Example 5 | 1.63 | 0.12 |

(Measurement of Dry Etching Rate)

The following etchers and etching gases were used for measuring the dry etching rate.

The ES401 etcher (trade name, manufactured by NIPPON SCIENTIFIC Co., Ltd.) was used, and the etching was performed with $CF_4$ gas.

The RIE-10NR etcher (trade name, manufactured by SAMCO INC.) was used, and the etching was performed with $O_2$ gas.

Solutions of the compositions for resist underlayer films prepared in Examples 1 to 14 and Comparative Examples 1 to 15 were coated with a spinner on silicon wafers. The resist underlayer films were formed by heating on a hot plate for 1 minute at 240° C., and etching rates were measured using each etching gas. For a resist underlayer film thickness of 0.20 µm, the etching rate was measured using $CF_4$ gas as the etching gas, and for a resist underlayer film thickness of 0.04 µm, the etching rate was measured using $O_2$ gas as the etching gas.

Further, resist films with a thickness of 0.20 µm and 0.04 µm were likewise formed on silicon wafers by coating a photoresist solution (trade name UV113, manufactured by Shipley Co.) with a spinner. The dry etching rate was measured using $CF_4$ gas and $O_2$ gas as the etching gases. The dry etching rates obtained for the resist underlayer film and the resist film were compared. The results are shown in Table 4. The rate ratio is the (resist underlayer film)/(resist) dry etching rate ratio.

TABLE 4

Dry etching rate ratio

| | $CF_4$ gas | $O_2$ gas |
|---|---|---|
| Example 1 | 1.76 | 0.02 |
| Example 2 | 1.77 | 0.02 |
| Example 3 | 1.80 | 0.02 |
| Example 4 | 1.83 | 0.02 |
| Example 5 | 1.83 | 0.02 |
| Example 6 | 1.80 | 0.02 |
| Example 7 | 1.79 | 0.02 |
| Example 8 | 1.82 | 0.02 |
| Example 9 | 1.84 | 0.02 |
| Example 10 | 2.01 | 0.02 |
| Example 11 | 2.08 | 0.02 |
| Example 12 | 2.09 | 0.02 |
| Example 13 | 2.13 | 0.02 |
| Example 14 | 2.16 | 0.02 |
| Comparative Example 1 | 1.65 | 0.02 |
| Comparative Example 2 | 1.65 | 0.02 |
| Comparative Example 3 | 1.65 | 0.02 |
| Comparative Example 4 | 1.65 | 0.02 |
| Comparative Example 5 | 1.83 | 0.02 |

(Preparation of Organic Underlayer Film)

16.5 g of acenaphthylene, 1.5 g of 4-hydroxystyrene, and 60 g of 1,2-dichloroethane as a solvent were placed in a 200 mL flask. 1 g of trifluoroboron was added as polymerization initiator, the temperature was raised to 60° C., and the reaction was conducted for 24 hours. To the solution obtained, 1 L of methanol and 500 g of water were added, reprecipitation purification was performed, and the obtained white material was filtered and dried to yield 11 g of a white polymer. The obtained polymer (corresponds to Formula (7-1)) was analyzed by 13C, 1H-NMR and GPC, and an acenaphthylene:4-hydroxystyrene ratio of 86:14 was obtained. Mw: 6000, Mw/Mn=1.5 was obtained.

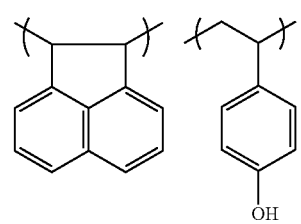

Formula (7-1)

1.0 g of tetramethoxymethyl glycoluril (trade name Powderlink 1174, manufactured by Mitsui Cytech Ltd.), 0.01 g of paratoluenesulfonic acid as a crosslinking catalyst, and 0.03 g of MEGAFAC R-30 (trade name, manufactured by Dainippon Ink and Chemicals Co., Ltd.) as a surfactant were added to 10 g of the obtained polymer (Formula (7-1)), followed by dissolution in 101.57 g of propylene glycol monomethyl ether acetate and 25.39 g of propylene glycol monomethyl ether. The solution of a composition for forming a resist underlayer film to be used in a lithographic process using a multilayer film was then obtained by filtration using a polyethylene microfilter with a pore diameter of 0.10 µm, and then a polyethylene microfilter with a pore diameter of 0.05 µm.

(Evaluation of Resist Patterning)

An organic underlayer film (layer A) with a thickness of 250 nm was obtained by coating a composition for forming the organic underlayer film (layer A) that included the above-mentioned polymer (Formula (7-1)) on a silicon wafer and baking on a hot plate for 1 minute at 240° C. The compositions for Si-containing resist underlayer films (layers B) obtained in Examples 1 to 14 and Comparative Example 1 to Example 5 were separately coated and heated on a hot plate for 1 minute at 240° C. to yield the Si-containing resist underlayer films (layers B) with a thickness of 40 nm. Photoresist films (layers C) with a thickness of 150 nm were then formed by coating a commercial photoresist solution (trade name PAR 855, manufactured by Sumitomo Chemical Co., Ltd.) with a spinner on each resist underlayer film and heating on a hot plate for 1 minute at 100° C. The resist patterning was performed using an immersion exposure device TWINSCAN XT: 1900Gi scanner manufactured by ASML (wavelength 193 nm, NA, σ: 1.20, 0.94/0.74 (C-quad) immersion liquid: water). The target was the so-called line-and-space (dense line) with a line width of photoresist and the interline width after the development of 0.05 μm, and the exposure was performed through a mask set so as to form 15 lines. The baking was then performed on a hot plate for 60 sec at 105° C., followed by cooling and development with a developer of 2.38% tetramethyl ammonium hydroxide in a 60-sec single paddle process according to JIS.

(Evaluation of Stability in Storage)

The compositions for forming a resist underlayer film were stored for 2 months at 23° C., and the coating film thickness measurement and lithography evaluation were conducted again.

The case in which the coating film thickness did not change in storage for 2 months at 23° C. is denoted by ○, and when the changes were observed, the amount of change is shown.

TABLE 5

Lithography Evaluation
Evaluation of Stability in Storage

| | Evaluation of lithography | Changes in coating film thickness after 2 months at 23° C. | Evaluation of lithography after 2 months at 23° C. |
|---|---|---|---|
| Example 1 | Good | ○ | Good |
| Example 2 | Good | ○ | Good |
| Example 3 | Good | ○ | Good |
| Example 4 | Good (partial undercut) | ○ | Good (partial undercut) |
| Example 5 | Good | ○ | Good |
| Example 6 | Good (partial undercut) | ○ | Good (partial undercut) |
| Example 7 | Good (partial undercut) | ○ | Good (partial undercut) |
| Example 8 | Good (partial undercut) | ○ | Good (partial undercut) |
| Example 9 | Good (partial undercut) | ○ | Good (partial undercut) |
| Example 10 | Good (partial footing) | ○ | Good (partial footing) |
| Example 11 | Good | ○ | Good |
| Example 12 | Good | ○ | Good |
| Example 13 | Good | ○ | Good |
| Example 14 | Good | ○ | Good |
| Comparative Example 1 | Footing | ○ | Footing |
| Comparative Example 2 | Footing | ○ | Footing |
| Comparative Example 3 | Footing | ○ | Footing |
| Comparative Example 4 | Footing | ○ | Footing |
| Comparative Example 5 | Undercut | 15% increase | Partial peel |

The resist underlayer film obtained from the composition for forming a resist underlayer film that has a diketone, enol, or keto ester structure according to the present invention includes a large number of hetero atoms and, therefore, has a sufficiently high dry etching rate with respect to a photoresist film. In Examples 1 to 14, since the etching rate with a fluorine-containing gas is increased over that in Comparative Example 1, the resist pattern of the upper layer of the resist underlayer film according to the present invention can be accurately transferred to the resist underlayer film according to the present invention.

The resist underlayer film obtained from the composition for forming a resist underlayer film of Examples 1 to 14 has the same resistance to etching with an oxygen-containing gas as the resist underlayer film obtained from the composition for forming a resist underlayer film of Comparative Example 1. Therefore, the resist underlayer film according to the present invention also functions sufficiently and effectively as a hard mask when the underlying organic underlayer film or substrate is processed.

When Examples 1, 4, and 5 and Comparative Examples 2 to 5 are compared with respect to the case in which 0.05 μm resist patterning is performed, the films of Examples 1, 4, and 5 that include a diketone, enol, or keto ester structure in the polymer demonstrate good lithography characteristics, while the compositions of Comparative Examples 2 to 4 containing no such structure in the polymer demonstrate a footing shape. It is therefore clear that the introduction of the aforementioned structure in the polymer inhibits the footing shape. In all of the materials, the stability is high because a diketone structure stabilizing the silanol is included, but the materials in which a diketone, enol, or keto ester structure is included in the polymer (Examples 1 to 14) are effective in terms of improving the initial characteristics and lithography characteristics after a predetermined period of time.

Meanwhile, in Comparative Example 5, a diester structure is included in the polymer, but the ester moiety is an acid-unstable group (t-butyl group) under sol-gel hydrolysis conditions. Therefore, the diester structure is changed to a dicarboxylic acid, thereby decreasing pKa, even when a 0.01 M/l dilute hydrochloric acid solution is used in the hydrolysis and condensation process of the hydrolyzable organosilane. Since a deprotection reaction thus occurs in the course of the sol-gel reaction, the pH of the system changes and the degree of acidity increases. As a result, the resist shape demonstrates an undercut shape. In addition, the stability in Comparative Example 5 becomes low because the pH of the system changes.

INDUSTRIAL APPLICABILITY

The present invention provides a composition for forming a lithographic resist underlayer film for forming a resist underlayer film that can be used as a hard mask. The present invention also provides a lithographic resist underlayer film that does not intermix with a resist and has a dry etching rate higher than that of the resist, and also a composition for forming a resist underlayer film to form such an underlayer film.

The invention claimed is:

1. A method for producing a semiconductor device, comprising the steps of:
    coating a composition for forming a lithographic resist underlayer film on a semiconductor substrate and performing baking to form a resist underlayer film;
    coating a composition for forming a resist film on the underlayer film and forming a resist film;
    exposing the resist film;
    developing the resist film after the exposure to obtain a patterned resist film;
    etching the resist underlayer film according to the patterned resist film to obtain a patterned resist underlayer film; and
    processing the semiconductor substrate according to the patterned resist film and the patterned resist underlayer film,
    wherein the composition for forming a resist underlayer film comprises as a silane, a hydrolyzable organosilane, a hydrolysate thereof, or a hydrolytic condensate thereof, wherein the silane includes a hydrolyzable organosilane of Formula (1) below:

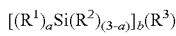  Formula (1)

[where $R^3$ is a group of Formula (2), (3), or (4):

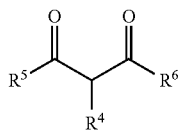  Formula (2)

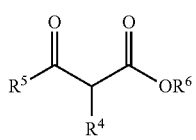  Formula (3)

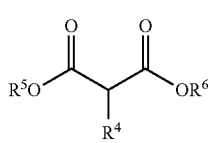  Formula (4)

(in Formulae (2), (3), and (4), at least one from among $R^4$, $R^5$, and $R^6$ is a group bonded to a silicon atom by a single bond or as a linking group; when $R^4$ is not bonded to the silicon atom, $R^4$ is a hydrogen atom, or an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof;

when $R^5$ and $R^6$ are not bonded to the silicon atom, each of $R^5$ and $R^6$ is independently a linear alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof;

when any of $R^4$, $R^5$ or $R^6$ is a group bonded to the silicon atom as a linking group, the group bonded to the silicon atom is a divalent group obtained by removing one hydrogen atom from the respective group defined above; however, when $R^6$ in Formula (3), $R^5$ in Formula (4), and $R^6$ in Formula (4) are bonded to the silicon atom, these groups are groups each bonded to the silicon atom as a linking group, rather than by a single bond);

each $R^1$ is independently an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof; each $R^2$ is independently an alkoxy group, an acyloxy group, or a halogen atom; a is integer of 0 to 2, b is integer of 1 to 3].

2. The method according to claim 1, wherein the hydrolyzable organosilane comprises at least one selected from a group consisting of a combination of at least one organosilicon compound selected from a group consisting of an organosilicon compound of Formula (5) below:

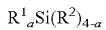  Formula (5)

(where each $R^1$ is independently an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an alkoxyaryl group, an acyloxyaryl group, or a cyano group, or a combination thereof, and is a group bonded to the silicon atom by a Si—C bond; each $R^2$ is independently an alkoxy group, an acyloxy group, or a halogen atom; a is integer of 0 to 3), and an organosilicon compound of Formula (6) below:

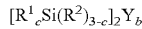  Formula (6)

(where $R^1$ is an alkyl group, each $R^2$ is independently an alkoxy group, an acyloxy group, or a halogen atom, Y is an alkylene group or an arylene group, b is integer of 0 or 1, and c is integer of 0 or 1), and the hydrolyzable organosilane of Formula (1), hydrolysates thereof, and hydrolytic condensates thereof.

3. The method according to claim 1, wherein the hydrolytic condensate of the hydrolyzable organosilane of Formula (1), or the hydrolytic condensate of the hydrolyzable organosilane of Formula (1) and the organosilicon compound of Formula (5) is contained as a polymer.

4. The method according to claim 1, wherein the hydrolyzable organosilane of Formula (1) has a pKa value of 8.00 to 20.00.

5. The method according to claim 1, wherein the composition for forming a lithographic resist underlayer film further comprises an acid as a hydrolysis catalyst.

6. The method according to claim 1, wherein the composition for forming a lithographic resist underlayer film further comprises water.

7. A method for producing a semiconductor device, comprising the steps of:

forming an organic underlayer film on a semiconductor substrate;

coating a composition for forming a lithographic resist underlayer film on the organic underlayer film and performing baking to forrrl a resist underlayer film;

coating a composition for forming a resist film on the resist underlayer film and forming a resist film;

exposing the resist film;

developing the resist film after the exposure to obtain a patterned resist film;

etching the resist underlayer film according to the patterned resist film to obtain a patterned resist underlayer film;

etching the organic underlayer film according to the patterned resist underlayer film; and processing the semiconductor substrate according to the patterned organic underlayer film, wherein the composition for forming a lithographic resist underlayer film comprises as a silane, a hydrolyzable organosilane, a hydrolysate thereof, or a hydrolytic condensate thereof, wherein the silane includes a hydrolyzable organosilane of Formula (1) below:

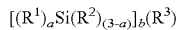  Formula (1)

[where $R^3$ is a group of Formula (2), (3), or (4):

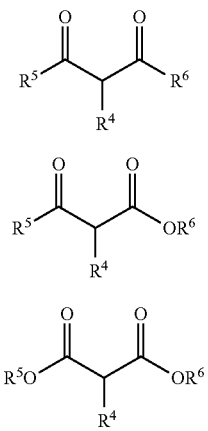

Formula (2)

Formula (3)

Formula (4)

(in Formulae (2), (3), and (4), at least one from among $R^4$, $R^5$, and $R^6$ is a group bonded to a silicon atom by a single bond or as a linking group; when $R^4$ is not bonded to the silicon atom, $R^4$ is a hydrogen atom, or an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof;

when $R^5$ and $R^6$ are not bonded to the silicon atom, each of $R^5$ and $R^6$ is independently a linear alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof;

when any of $R^4$, $R^5$ or $R^6$ is a group bonded to the silicon atom as a linking group, the groin bonded to the silicon atom is a divalent group obtained by removing one hydrogen atom from the respective group defined above; however, when $R^6$ in Formula (3), $R^5$ in Formula (4), and $R^6$ in Formula (4) are bonded to the silicon atom, these groups are groups each bonded to the silicon atom as a linking group, rather than by a single bond);

each $R^1$ is independently an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an amino group, or a cyano group, or a combination thereof; each $R^2$ is independently an alkoxy group, an acyloxy group, or a halogen atom; a is integer of 0 to 2, b is integer of 1 to 3].

8. The method according to claim 7, wherein the hydrolyzable organosilane comprises at least one selected from a group consisting of a combination of at least one organosilicon compound selected from a group consisting of an organosilicon compound of Formula (5) below:

$$R^1_a Si(R^2)_{4-a} \quad \text{Formula (5)}$$

(where each $R^1$ is independently an alkyl group, an aryl group, an aralkyl group, an alkyl halide group, an aryl halide group, an aralkyl halide group, an alkenyl group, or an organic group having an epoxy group, an acryloyl group, a methacryloyl group, a mercapto group, an alkoxyaryl group, an acyloxyaryl group, or a cyano group, or a combination thereof, and is a group bonded to the silicon atom by a Si—C bond; each $R^2$ is independently an alkoxy group, an acyloxy group, or a halogen atom; a is integer of 0 to 3), and an organosilicon compound of Formula (6) below:

$$[R^1_c Si(R^2)_{3-c}]_2 Y_b \quad \text{Formula (6)}$$

(where $R^1$ is an alkyl group, each $R^2$ is independently an alkoxy group, an acyloxy group, or a halogen atom, Y is an alkylene group or an arylene group, b is integer of 0 or 1, and c is integer of 0 or 1), and the hydrolyzable organosilane of Formula (1), hydrolysates thereof, and hydrolytic condensates thereof.

9. The method according to claim 7, wherein the hydrolytic condensate of the hydrolyzable organosilane of Formula (1), or the hydrolytic condensate of the hydrolyzable organosilane of Formula (1) and the organosilicon compound of Formula (5) is contained as a polymer.

10. The method according to claim 7, wherein the hydrolyzable organosilane of Formula (1) has a pKa value of 8.00 to 20.00.

11. The method according to claim 7, wherein the composition for forming a lithographic resist underlayer film further comprises an acid as a hydrolysis catalyst.

12. The method according to claim 7, wherein the composition for forming a lithographic resist underlayer film further comprises water.

* * * * *